(12) United States Patent
Conn

(10) Patent No.: US 8,222,086 B2
(45) Date of Patent: Jul. 17, 2012

(54) INTEGRATED SEMICONDUCTOR SUBSTRATE STRUCTURE USING INCOMPATIBLE PROCESSES

(75) Inventor: Robert O. Conn, Laupahoehoe, HI (US)

(73) Assignee: Research Triangle Institute, Research Triangle Park, NC (US)

( * ) Notice: Subject to any disclaimer, the term of this patent is extended or adjusted under 35 U.S.C. 154(b) by 26 days.

(21) Appl. No.: 13/065,976

(22) Filed: Apr. 4, 2011

(65) Prior Publication Data

US 2011/0183469 A1 Jul. 28, 2011

Related U.S. Application Data

(63) Continuation of application No. 11/975,966, filed on Oct. 22, 2007, now Pat. No. 7,944,041.

(60) Provisional application No. 60/995,194, filed on Sep. 24, 2007.

(51) Int. Cl.
*H01L 21/00* (2006.01)

(52) U.S. Cl. ............. 438/119; 438/54; 438/55; 438/69; 438/67; 438/108; 257/691; 257/532; 257/767; 257/751; 257/758

(58) Field of Classification Search .................. 438/119, 438/54, 55, 69, 67, 108; 257/691, 532, 767, 257/751, 758
See application file for complete search history.

(56) References Cited

U.S. PATENT DOCUMENTS

| | | | |
|---|---|---|---|
| 5,172,310 A | 12/1992 | Deam et al. | 363/144 |
| 5,208,491 A | 5/1993 | Ebeling et al. | 326/41 |
| 5,236,118 A | 8/1993 | Bower et al. | 228/193 |
| 5,511,428 A | 4/1996 | Goldberg et al. | 73/777 |
| 5,655,290 A | 8/1997 | Moresco et al. | 29/830 |
| 5,790,771 A | 8/1998 | Culbertson et al. | 714/3 |
| 5,805,533 A | 9/1998 | Daigle et al. | 368/226 |
| 5,834,705 A | 11/1998 | Jonaidi | 174/261 |
| 5,891,761 A | 4/1999 | Vindasius et al. | 438/109 |
| 5,949,030 A | 9/1999 | Fasano et al. | 174/262 |
| 6,204,164 B1 | 3/2001 | Orchard-Webb | 438/615 |
| 6,206,705 B1 | 3/2001 | Bolotin et al. | 439/69 |
| 6,221,769 B1 | 4/2001 | Dhong et al. | 438/667 |
| 6,259,160 B1 | 7/2001 | Lopatin et al. | 257/762 |
| 6,379,982 B1 | 4/2002 | Ahn et al. | 438/14 |
| 6,555,467 B2 | 4/2003 | Hsu et al. | 438/633 |
| 6,598,216 B2 | 7/2003 | Chan et al. | 716/115 |
| 6,650,301 B1 | 11/2003 | Zimmerman | 343/803 |
| 6,660,564 B2 | 12/2003 | Brady | 438/119 |
| 6,694,464 B1 | 2/2004 | Quayle et al. | 714/725 |
| 6,734,504 B1 * | 5/2004 | Lie et al. | 257/355 |
| 6,768,205 B2 | 7/2004 | Taniguchi et al. | 257/774 |

(Continued)

*Primary Examiner* — Telly Green
(74) *Attorney, Agent, or Firm* — Imperium Patent Works; T. Lester Wallace; Darien K. Wallace

(57) ABSTRACT

A plurality of FPGA dice is disposed upon a semiconductor substrate. In order both to connect thousands of signal interconnect lines between the plurality of FPGA dice and to supply the immense power required, it is desired that the substrate construction include two different portions, each manufactured using incompatible processes. The first portion is a signal interconnect structure containing a thin conductor layers portion characterized as having a plurality of thin, fine-pitch conductors. The second portion is a power connection structure that includes thick conductors and vertical through-holes. The through-holes contain conductive material and supply power to the FPGA dice from power bus bars located at the other side of the semiconductor substrate. The portions are joined at the wafer level by polishing the wafer surfaces within a few atoms of flatness and subsequent cleaning. The portions are then fusion bonded together or combined using an adhesive material.

20 Claims, 16 Drawing Sheets

U.S. PATENT DOCUMENTS

| | | | |
|---|---|---|---|
| 7,048,548 B2 | 5/2006 | Mathieu et al. | 439/66 |
| 7,409,610 B1 | 8/2008 | Drimer | 714/725 |
| 2002/0134581 A1 | 9/2002 | Figueroa et al. | 174/260 |
| 2002/0134685 A1 | 9/2002 | Chakravorty et al. | 205/125 |
| 2002/0163062 A1 | 11/2002 | Wang et al. | 257/641 |
| 2003/0107117 A1 | 6/2003 | Antonell et al. | 257/684 |
| 2003/0183940 A1 | 10/2003 | Noguchi et al. | 257/767 |
| 2004/0038195 A1 | 2/2004 | Nerenberg et al. | 435/4 |
| 2004/0179344 A1 | 9/2004 | Uchida et al. | 361/777 |
| 2005/0104221 A1 | 5/2005 | Memis | 257/778 |
| 2005/0150683 A1 | 7/2005 | Farnworth et al. | 174/255 |
| 2005/0170626 A1* | 8/2005 | Suga | 438/597 |
| 2006/0027934 A1 | 2/2006 | Edelstein et al. | 257/774 |
| 2006/0125094 A1 | 6/2006 | Lin | 257/734 |
| 2006/0170110 A1 | 8/2006 | Akram et al. | 257/774 |
| 2006/0190846 A1 | 8/2006 | Hichri et al. | 716/122 |
| 2006/0226450 A1 | 10/2006 | Furuta et al. | 257/208 |
| 2007/0012475 A1 | 1/2007 | Kawaguchi et al. | 174/255 |
| 2007/0210400 A1 | 9/2007 | Moribayashi et al. | 257/440 |
| 2007/0257356 A1* | 11/2007 | Abe et al. | 257/700 |
| 2008/0054486 A1 | 3/2008 | Murayama et al. | 257/774 |
| 2008/0253085 A1 | 10/2008 | Soffer | 361/679.4 |

* cited by examiner

INTEGRATED SEMICONDUCTOR SUBSTRATE STRUCTURE USING INCOMPATIBLE PROCESSES

CROSS REFERENCE TO RELATED APPLICATION

This application is a continuation of, and claims priority under 35 U.S.C. §120 from, nonprovisional U.S. patent application Ser. No. 11/975,966 entitled "Integrated Semiconductor Substrate Structure Using Incompatible Processes," filed on Oct. 22, 2007, now U.S. Pat. No. 7,944,041, the subject matter of which is incorporated herein by reference. Application Ser. No. 11/975,966 in turn claims the benefit under 35 U.S.C. §119(e) of provisional U.S. patent application Ser. No. 60/995,194, entitled "Semiconductor Substrate Stack High Performance Computer," filed on Sep. 24, 2007, the subject matter of which is incorporated herein by reference.

TECHNICAL FIELD

The described embodiments relate to packaging semiconductor devices characterized by a large number of high speed signal and power connections combined with high power consumption.

BACKGROUND INFORMATION

The current state of the art of semiconductor development is the mass production of large integrated circuits "IC's" containing several million active components. One type of device fitting this description is a large Field Programmable Gate Array "FPGA." FPGAs and other devices may operate at speeds of several hundred Megahertz, and it is not unusual that these integrated circuits include over a thousand pins that bring high speed signals into and out of the integrated circuit die. With a large number of active internal components switching at high speeds, these devices consume large amounts of power. Therefore, it is necessary to have a packaging solution that allows for the distribution of over a thousand high speed signal lines and also provides for a plurality of connections to supply power to the device. To solve this problem for a single FPGA, IC designers have used a technique wherein thousands of "bumps" are distributed over the surface of the FPGA via thick metal lines. It would not be unusual to have two-thousand bumps for power and another two thousand for ground. The large number of bumps reserved for power ensures only a minimal resistive drop from the surface of the device to the active devices within the FPGA.

The power and signal connections extend from the bumps present on the surface of the FPGA to balls of a ball-grid-array "BGA" package. A BGA utilized for packaging a large FPGA has approximately fifteen-hundred balls; one-thousand for input and output "I/O" connections and five-hundred for power and ground connections. Power is supplied to the balls of the BGA package through thick metal conductors to the bumps present on the surface of the FPGA.

The bumped FPGA construction and BGA package is adequate to power and connect a single FPGA but it is not adequate to power and connect a system of many FPGAs. The problems associated with the large number of signals and the high power requirements of a single FPGA are multiplied when several devices are required for use within a single system. In this case, many thick conductors are needed for power connections while many minimum-width conductors are required for routing high speed input and output signals. Thus, a larger substrate is needed for the increased routing requirements while the area needed for routing all of these signals should be minimized for the highest possible system performance.

Improved performance is obtained with the utilization of a silicon wafer as a semiconductor substrate. Even with the use of a silicon substrate, however, multiple layers with multiple cross-overs are used to route the large number of signals and power. The addition of multiple layers to allow for the requisite signal density further decreases performance and increases fabrication costs.

U.S. Pat. No. 6,221,769 discusses a method to decrease the density of signal lines and to increase performance by creating a semiconductor chip package having a silicon substrate with substrate vias for connecting to a power source and other electronic devices. As shown in FIG. 1 (Prior Art), a plurality of integrated circuit dice 100 are connected to multilevel wiring layer 107 using die bonding bumps 109. Power is routed from integrated circuit die 100 through die bonding bumps 109 through the multilevel wiring layer 107 and to the bonding balls 103 via through substrate vias 105.

U.S. Pat. No. 5,236,118 describes a process for aligning and bonding of complimentary electrical structures and is hereby incorporated by reference. The described process is applicable to fabrication of semiconductor devices from separate structures and employs direct silicon bonding.

FIG. 2 (Prior Art) shows a similar structure except power is routed from the integrated circuit die 100 to contacts 110 using through-substrate vias 105. Contacts 110 can be a grid array made of ceramic or a copper based material. The prior art describes a method for drilling three thousand to five thousand substrate vias through the wafer, the substrate vias having a one millimeter diameter with one millimeter spacing. Once the substrate vias have been created in the prior art process, the vias are electroplated, and standard dual damascene processing forms the multilevel wiring that connects to the substrate vias.

If standard spin-on resist processing, used to create the multilevel wiring structures, is performed with unfilled through-substrate vias present in the wafer, uneven thicknesses of photoresist during spin-on of the photoresist material will occur over the surface of the wafer. Etching of the photoresist will not be uniform, resulting in a large number of defects and increased fabrication cost or reduced wafer yield. This method is not suitable for mass manufacturing.

Dry film resist processing for the multilevel wiring will not have the uneven thickness issues present with wet or liquid resist processing and can be used to create thick conductors used for power routing. However, dry film processing is not suitable for feature sizes of less than twenty or thirty microns, and thus dry film processing is not suitable for creation of conductors required for routing thousands of signal lines.

U.S. Pat. No. 6,379,982 discusses a semiconductor wafer-on-wafer package, which is shown in FIG. 3 (Prior Art). FIG. 3 displays a cross-sectional drawing of a portion of an unsingulated die of a wafer-on-wafer package, the wafer-on-wafer package constructed for the purpose of testing and burning-in the die prior to singulation. In FIG. 3, die bond pad 202 is shown protruding slightly from the surface of device wafer 200 which is the active surface of a semiconductor die contained therein. Conductive trace 215, which may be copper, a copper based alloy, or any suitable electrically conductive material is disposed on support wafer 225 and is shown contacting bond pad connection point 204. The bond pad connection point is a solder ball or bump and is disposed upon conductive trace 215. Through-wafer via 210 is preformed in support wafer 225 prior to attaching device wafer 200 to support wafer 225. The through-wafer via is created by laser drilling, electrochemical anodization, or by an etching process and has an internal diameter of approximately sixty microns. Conductive filling material 206 is disposed within through-wafer via 210 such that an electrical connection is made to device wafer 200 via die bond 202, by bond pad connection point 204, conductive filling material 206 and bump 207. Bump 207 is electrically conductive and is used to make electrical contact to mounting pad 208 of mounting substrate 206. Gap 201 is shown between the device wafer 200 and passivation layer 205. While the prior art drawing in FIG. 3 illustrates a method of producing a silicon package with through-wafer vias, the silicon packages described do not provide connections to multiple semiconductor integrated circuits disposed on device wafer 200. Thus, the wafer-on-wafer package does not appear to have multiple conductive layers of varying thicknesses necessary both to provide power and to route thousands of connections from one semiconductor IC to another.

A method of making a semiconductor package is therefore desired that supports; 1) construction of thin, fine-pitch conductors for routing signal connections between a plurality of semiconductor ICs, 2) construction of thick conductors, characterized as having large feature sizes, for the lateral conduction of power to the semiconductor ICs and 3) through-holes for conducting the power supply through a semiconductor body to facilitate the increased density of thin conductors between semiconductor ICs on the silicon substrate.

SUMMARY

A plurality of FPGA dice or other components are disposed upon a semiconductor substrate. In order to 1) connect thousands of interconnect lines between the FPGA die and 2) supply the immense amount of power required for these types of devices, it is necessary to construct a package out of a semiconductor substrate. It is also necessary that the construction of the package includes two different portions that are built using incompatible processes. The first of such portions is an interconnect structure containing a thin conductor layers portion characterized as having a plurality of thin fine-pitch conductors. These fine-pitch conductors are used to make high speed and other signal connections between the multiple FPGA dice. Produced by standard dual damascene processing utilizing wet resist processing, the thin conductive layers are approximately less than one micron thick and less than twenty microns in width. Using this type of processing, the thin fine-pitch conductive layers can be made of sufficient density to pattern thousands of conductive traces necessary for interconnecting the plurality of FPGA dice mounted at the surface of the semiconductor substrate.

For the power connections, these interconnect types of connections are not thick enough to bring in power supply currents into the FPGA devices, and even if these layers could be used, the additional area required to route the power connections would reduce area needed for the high density interconnect conductors. In addition, the conductor materials for power routing may be different than conductor material used for interconnect signal layers. Therefore, a second structure is required to route sufficient power to the plurality of FPGA dice. This second structure, a power connection structure, includes thick conductors and vertical through-holes. It is due to these vertical through-holes that the processing used to create the power connection structure may be different from, and incompatible with, the process used to create the interconnect structure. The thick conductive layers are patterned using dry film resist. Dry film resist is used because of the presence of the through-holes on the surface of the power connection structure. If wet resist is used, the conductive through-holes do not allow for a uniform surface during spin-on of wet photoresist. Additionally, dry resist is a lower cost process than wet or liquid resist processing. Turbulence caused by the through-holes during the spin-on processing of liquid photoresist prohibits a uniform thickness of that material. Because dry film resist processing involves thicker layers of photoresistive material that spans the open via holes, minimum feature size issues are associated with dry film processing. Feature sizes, line widths and spacing smaller than twenty or thirty microns cannot be resolved using dry film photoresist because of its thickness. Therefore, while the dry film resist produces a pattern of conductors sufficient to route power conductors, it is impossible to obtain the density required for creating conductors useful for high density signal routing.

As stated above, the power connection structure contains conductive through-holes and thick conductor layers. The through-holes, approximately 25 microns or greater in diameter, are used to electrically couple thick conductors on the bottom plane of the semiconductor substrate to thick conductors present on multiple layers below the plurality of FPGA dice. The through-holes in this power connection structure are partially or completely filled by a conductive material and are of a density similar to the density of power bumps present on FPGA dice mounted to the semiconductor substrate. These through-holes are utilized for power and ground connections that extend vertically through the semiconductor substrate into laterally extending thick conductors. The thickness of the substrate may be approximately seven hundred microns.

The lateral thick conductors are approximately two microns or more in thickness and are used to traverse a minimum lateral distance before they can be routed to the surface of the semiconductor substrate and into an FPGA die via bonding bumps disposed upon the surface of the semiconductor substrate. These die bonding bumps are arrayed to match the corresponding array of lands present on the particular FPGAs to be attached to the semiconductor substrate. Coupled to the underside of the semiconductor substrate below the thick conductor layers is a plurality of power bus bar structures with decoupling capacitors disposed between the power bus bar structures. These power bus bar structures are made of copper or a similar conductive material and are approximately 1.5 millimeters high by 1.5 millimeters wide. There are ten or so of these power bus bars under each FPGA die, and each power bus bar spans the entire width of the semiconductor substrate. Each copper bus bar may have a hundred or more vertical connections facilitated by the vertical through-hole conductors such that the IR drop is less than approximately twenty to thirty millivolts. This small amount of loss can be compensated for by a similar increase in the power supply used to supply the FPGA devices. During processing, expansion and contraction caused by rapid heating to a high temperature and subsequent cooling stresses the power connection structure at the junction of different materials. The vertical through-holes also serve to reduce stress at the junction of the copper plane and semiconductor material by riveting the copper plane to the semiconductor substrate at thousands of locations.

Both the interconnect structure and the power connection structure are greater than two inches on one side and are each constructed on a wafer that contains only like structures. This is necessitated by the incompatible processing requirements of each type of structure. To connect the two structures together, they are joined at the wafer level and then singulated. In other embodiments, the singulation from the wafers occurs before the power connection structure and interconnect structure are bonded together. This process allows for both structures to be tested independent of the other, and defective structures can be removed from the process before adhesion to the other type of structure. In yet another embodiment, the power connection structure is manufactured and then singulated, tested-good interconnect structures are added to the power connection structures. This permits better overall yield and manufacturability of the semiconductor substrate. To join the two wafers, the surface of the each wafer is polished to within a few atoms of flatness and subsequently cleaned. The wafers are then aligned utilizing through-holes or other structures as guides. The wafers are then brought into physical contact where atomic or crystalline bonding occurs naturally and without the use of adhesives. This process, fusion bonding, produces bonds of approximately 10.5 kcal/mol which are sufficient to hold the wafers firmly together. After the two wafers are fusion bonded, additional processing may be performed, for example, vias may be disposed onto the fusion bonded structure. Additionally, die bond pads and bumps are added to the surface of the interconnect structure to facilitate mounting of the multiple FPGA dice.

Once completed, multiple layers of semiconductor substrates can be included within a single system by creating a stack of semiconductor substrates joined with Shin-Etsu conductive filament elastomeric connectors disposed between the substrates. Through-holes are positioned within a first area which includes a first density of four holes per each bus conductor. These through-holes, approximately 25 microns or greater in diameter, allow for signals to pass from one semiconductor substrate to semiconductor substrates above or below it when configured within a stack of multiple semiconductor substrates. This first density of through-holes within the first area of the semiconductor substrate also permits the connections of the plurality of FPGA dice to be directed into and out of each semiconductor substrate.

In other embodiments, processes that are incompatible due to temperatures used in processing may be combined by fusion bonding. In yet another embodiment, structures created by high cost or low-yielding processes may be combined with structures manufactured via low cost, high-yield processes by fusion bonding the incompatible structures.

Further details, embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
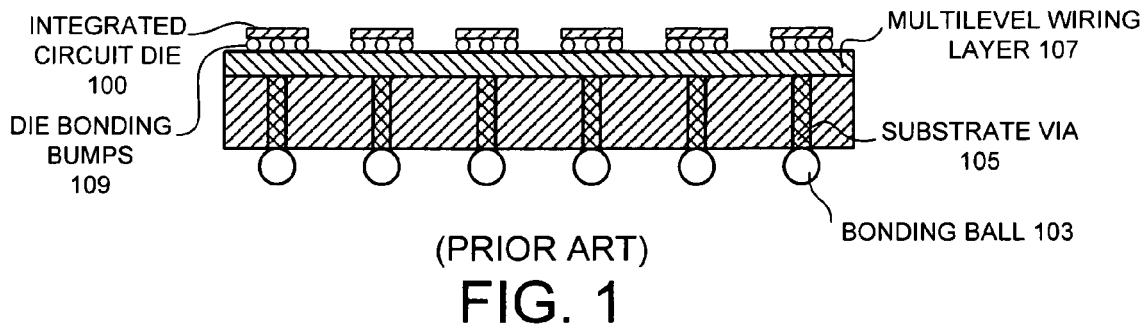
FIG. 1 (Prior Art) is a cross-sectional diagram of a plurality of integrated circuit dice mounted on a semiconductor substrate containing a plurality of through substrate vias.
Figure 2:
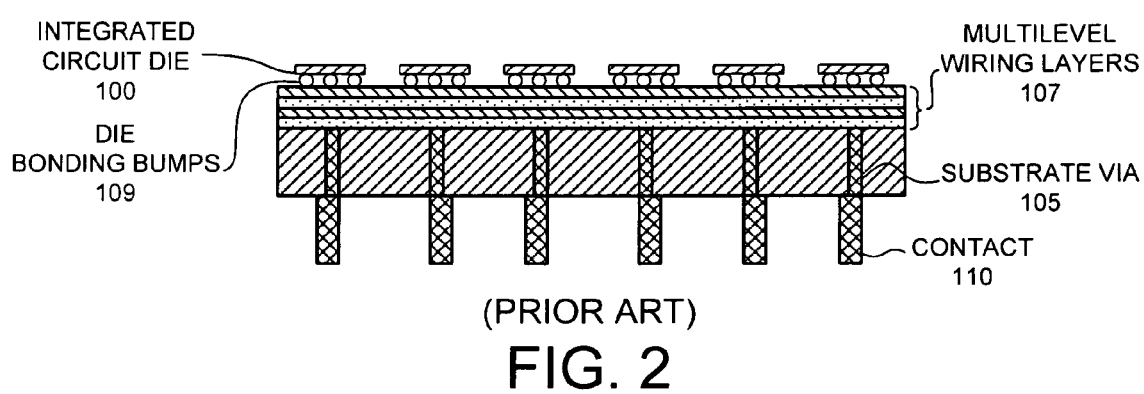
FIG. 2 (Prior Art) is a cross-sectional diagram of a semiconductor substrate showing a plurality of contacts disposed along the bottom surface of the semiconductor substrate.
Figure 3:
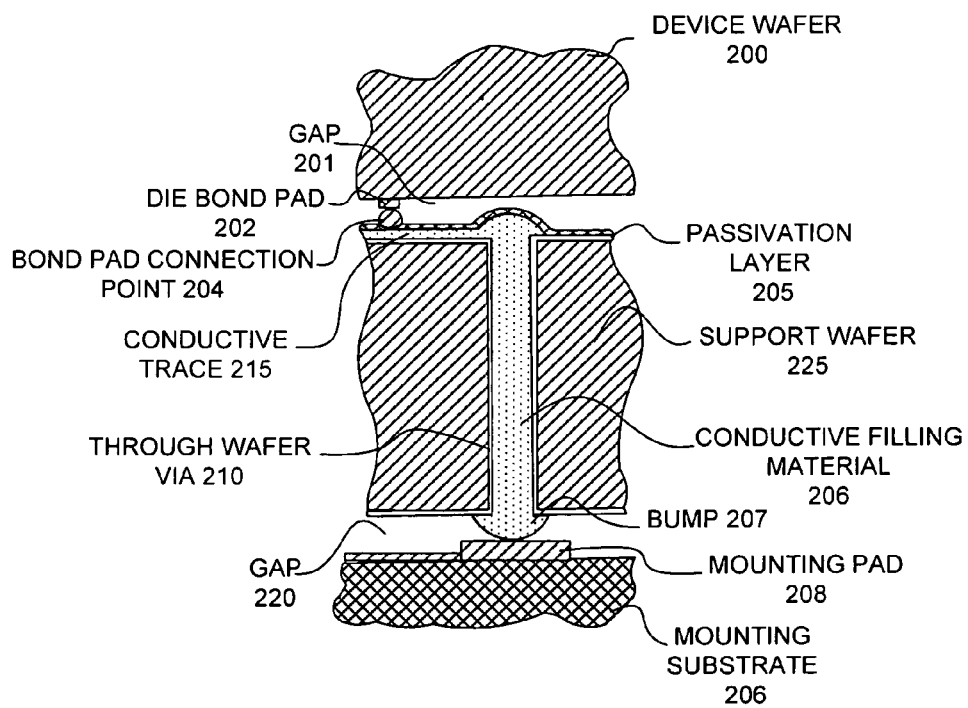
FIG. 3 (Prior Art) is a cross-sectional view of an unsingulated die mounted upon a semiconductor substrate with a single through-wafer via extending through a semiconductor support wafer.
Figure 4:
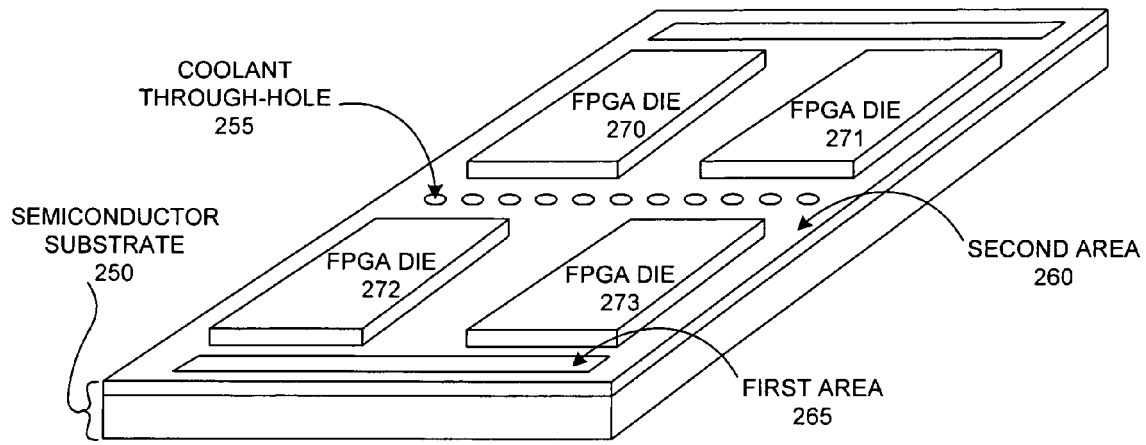
FIG. 4 is a perspective view of a plurality of FPGA dice mounted upon a semiconductor substrate.

FIG. 4 is drawing of a fusion bonded semiconductor substrate 250 in accordance with one novel aspect. A plurality of FPGA dice 270-273 is disposed upon a semiconductor substrate. The substrate has a first area 265 containing a first density of through-holes, a second area 260 containing a second density of through-holes, and coolant through-holes 255. The first density of through-holes allows for straight-through vertical connections through the substrate at the edges of the semiconductor substrate. Multiple layers of semiconductor substrates can be configured in a stack with Shin-Etsu conductive filament elastomeric connectors between the substrates. A bus of parallel extending bus conductors extends through the through holes and conductive filaments of the elastomeric connectors, from the top of the stack to the bottom of the stack. The first density of through-holes allows for four holes per each bus conductor. These through-holes extend through the wafer, are approximately 25 microns or greater in diameter, and allow for signals to pass from the semiconductor substrate of FIG. 4 to a semiconductor substrate immediately below or immediately above it when configured within a stack of multiple semiconductor substrates. This first density of through-holes within the first area of the semiconductor substrate 250 also permits FPGA die connections to be directed into and out of the semiconductor substrate.

The second area 260 of the semiconductor substrate of FIG. 4 contains a second density of through-holes that is used to couple thick conductors on the bottom plane of the semiconductor substrate to thick conductors present on multiple layers below the plurality of FPGA dice 270-273. The through-holes in the second area 260 of the semiconductor substrate 250 are of a density similar to the density of power bumps present on the bottom surfaces of the FPGA dice. These through-holes of the second area 260 are utilized for power and ground connections that extend vertically through the semiconductor substrate 250 into laterally conducting thick conductors. The laterally conducting thick conductors are then coupled through power bumps to the FPGA such to create an electrical connection characterized by less than twenty millivolts or thirty millivolts of resistive drop. In a system containing multiple layers of semiconductor substrates it is foreseeable that power in the range of several kilowatts may be consumed. To prevent overheating, liquid coolant is circulated below each semiconductor substrate. The presence of coolant through-holes 255 extending completely through the semiconductor substrate permits coolant to pass through the semiconductor substrate to the upper surface of the semiconductor substrate. In another embodiment, semiconductor through-holes are not disposed through the semiconductor substrate because the flow of coolant immediately below the semiconductor substrate is sufficient to prevent overheating.

Figure 5:
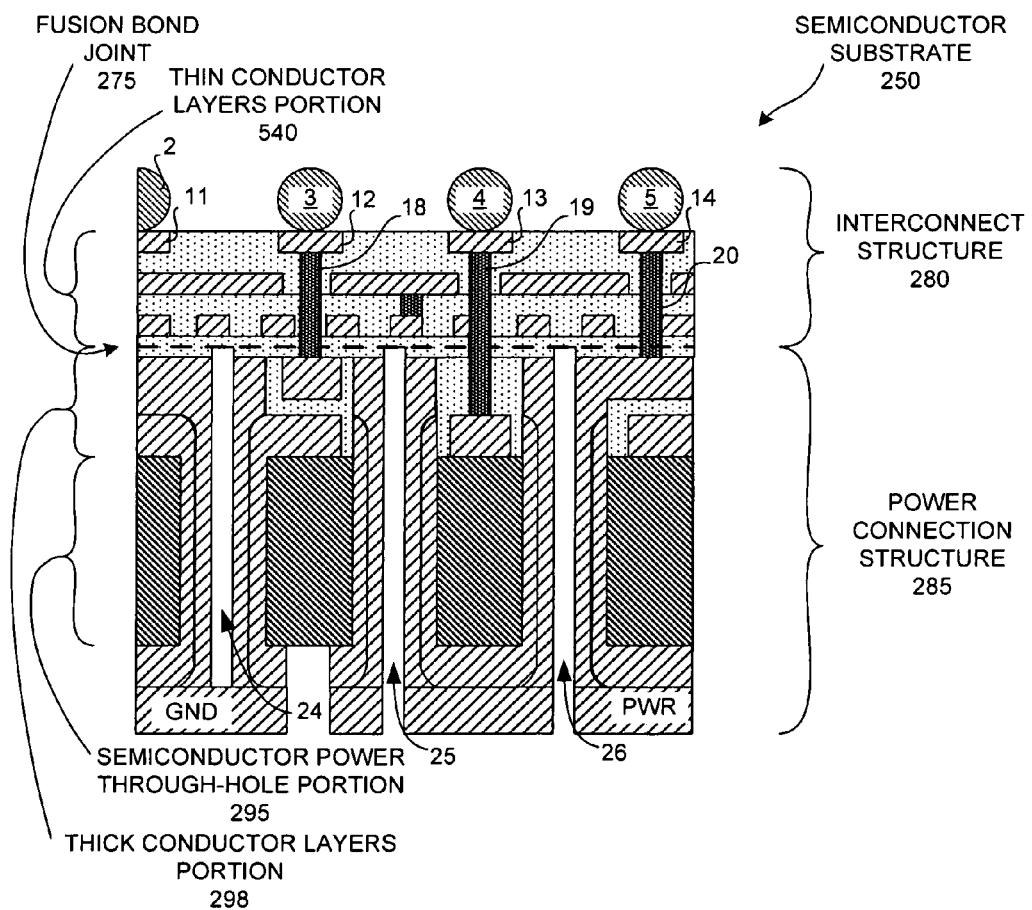
FIG. 5 is a cross-sectional diagram of the semiconductor substrate of FIG. 4 with an interconnect structure adhered to a power connection structure showing a plurality of through-holes in accordance with one novel aspect.

FIG. 5 is a cross-sectional drawing of the semiconductor substrate of FIG. 4. An interconnect structure 280 containing a "thin conductor layers portion" 540 characterized as having a plurality of thin fine-pitch conductors is disposed onto a "power connection structure" 285. A plurality of thick and wide horizontal conductors is disposed within a "thick conductor layers portion" 298 within the power connection structure and a plurality of through-holes 24-26 extends vertically through a semiconductor power through-hole portion 295 within the power connection structure 285. These thick and wide horizontal conductors present within the power connection structure 285 are of a thickness of approximately two microns or greater. A conductive via is disposed within each through-hole, 24-26. A plurality of die bonding bumps 2-5 is disposed upon the thin conductor layers portion 540. The die bumps 2-5 are arrayed to match the corresponding array of lands 11-14 present on the FPGAs to be disposed onto the semiconductor substrate. The die bonding bumps 2-5 conduct power to the FPGA dice through vertical vias within through-holes 24-26 to thick horizontal conductive layers present within the thick conductor layers portion 298. The thick conductor layers are then electrically coupled to a thick conductor layer present on the bottom plane of the semiconductor power through-hole portion by the conductive vias disposed within the semiconductor power through-hole portion. In this manner, a large amount of current required by the FPGA devices is conducted vertically through the power connection structure 285 to thick conductors within the thick conductor layers portion 298 to vias 18-20 extending through the interconnect structure 280 to lands 11-14 and then to die bonding bumps 2-5 that interface to the power connections disposed upon the surface of the FPGA. This provides for low resistance power connections through the substrate while simultaneously allowing the maximum density of thin fine-pitch conductor interconnects within the interconnect structure 280 for routing signals between the plurality of FPGA dice disposed on the semiconductor substrate.

In this FIG. 5, interconnect structure 280 containing the thin conductor layers portion 540 is fusion bonded to the power connection structure 285 containing the thick conductor layers portion 298. Fusion bonding permits the planar surfaces of the interconnect structure 280 and the power connection structure 285 to contact each other physically within atomic dimensions such that direct bonds exist between the two structures obviating any need for adhesive material between the two structures. In another embodiment, interconnect structure 280 and power connection structure 285 are connected through the use of adhesive materials between the structures.

Figure 6:
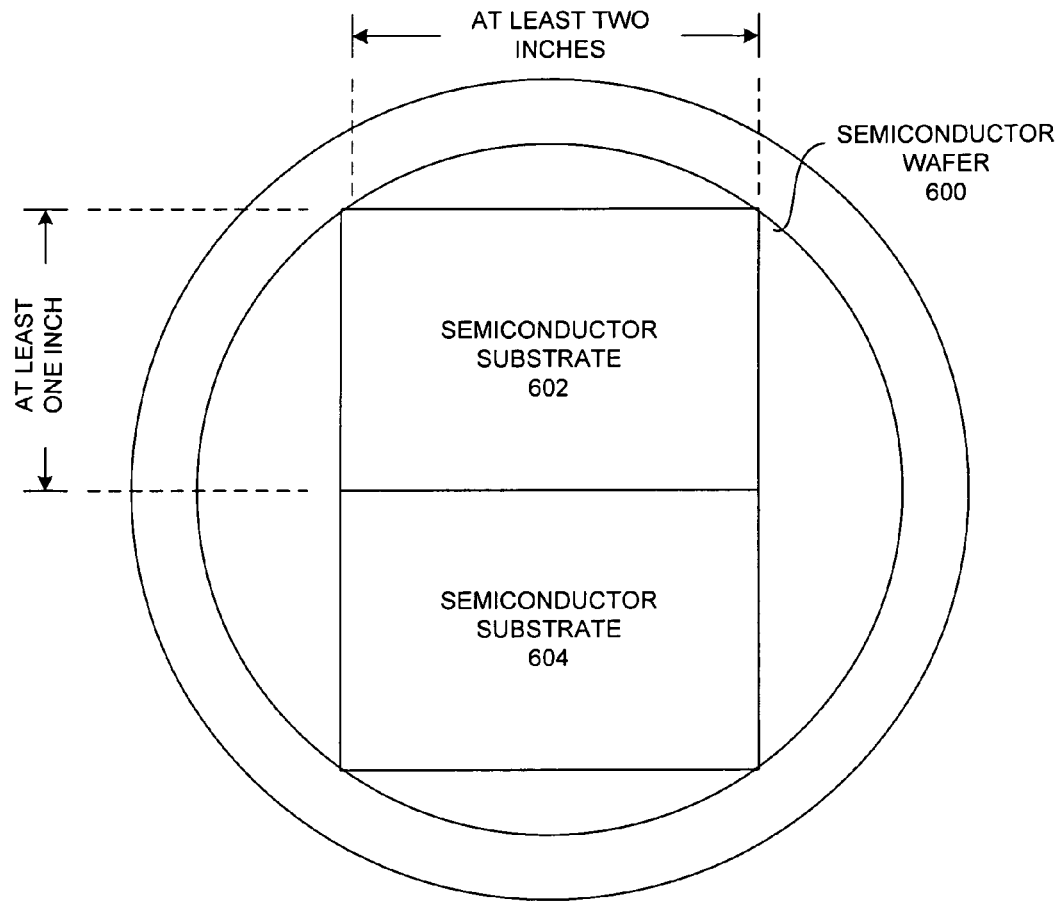
FIG. 6 is a diagram of how two semiconductor substrates are cut from a semiconductor wafer.

FIG. 6 is a drawing that shows a semiconductor substrate 602 and a semiconductor substrate 604 disposed on a semiconductor wafer 600. In this example, semiconductor wafer 600 is a wafer of single-crystal silicon material. Each semiconductor substrate shown in FIG. 6 is at least two inches in width and at least one inch in length and is large enough to accommodate several FPGA dice.

Figure 7:
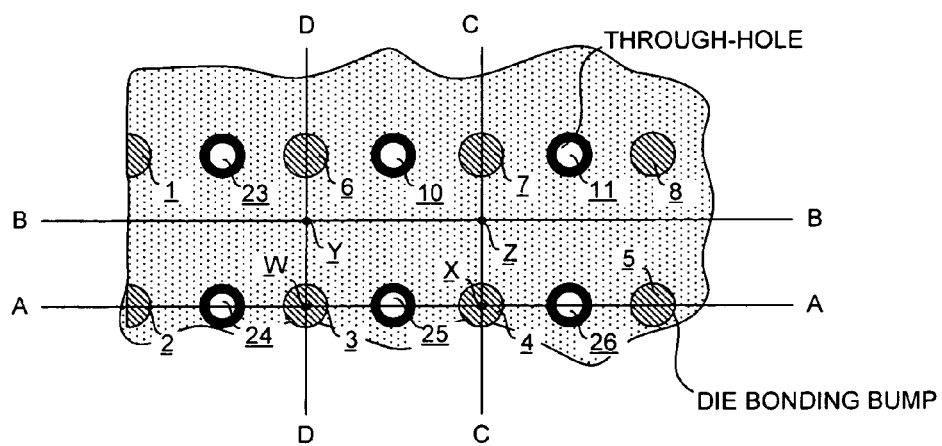
FIG. 7 is a top down diagram of a semiconductor substrate portion with four planes extending through the semiconductor substrate.

FIG. 7 is a top down drawing of a semiconductor substrate portion showing a plurality of through-holes 10, 11, and 23-26 and a plurality of die bonding bumps 1-8. Planes A and B extend horizontally and are perpendicular to plane C and plane D. Plane A intersects several through-holes 8 and die bonding bumps 9. Plane C and plane D intersect die bonding bumps 9 and no through-holes. Plane B intersects the semiconductor substrate portion without intersecting through-holes 8 or die bonding bumps 9. Plane A intersects plane D at a point "W" and plane A intersects plane C at a point "X." Plane B intersects plane D at a point "Y" and plane B intersects plane C at a point "Z."

Figure 8:
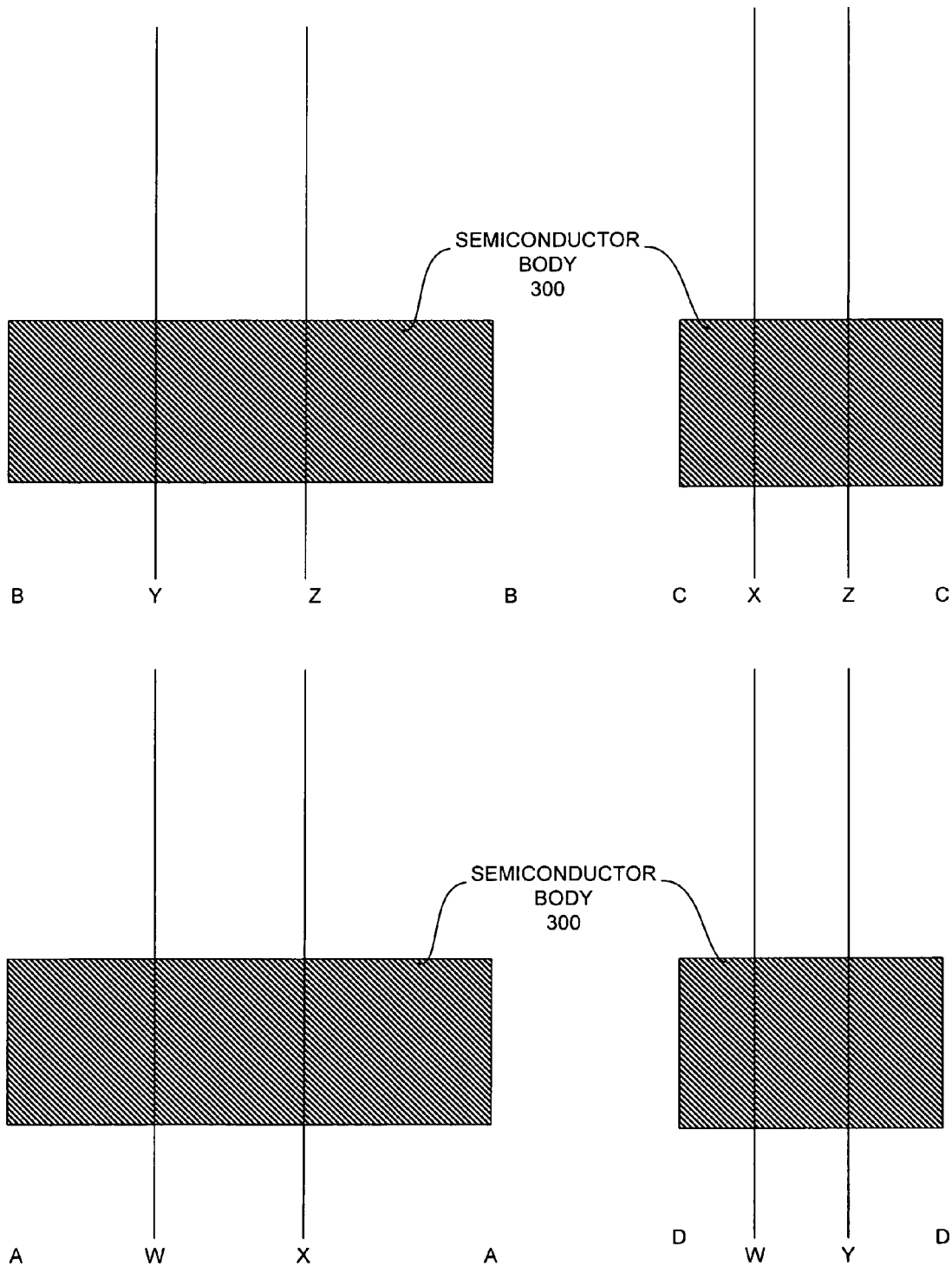
FIG. 8 is a cross-sectional drawing through each of four planes of a semiconductor body utilized in the invention.

FIG. 8 is a cross-sectional diagram of semiconductor body 300 through each of four planes A, B, C, and D. Semiconductor body 300 is utilized in the present invention to create the semiconductor power through-hole portion.

Figure 9:
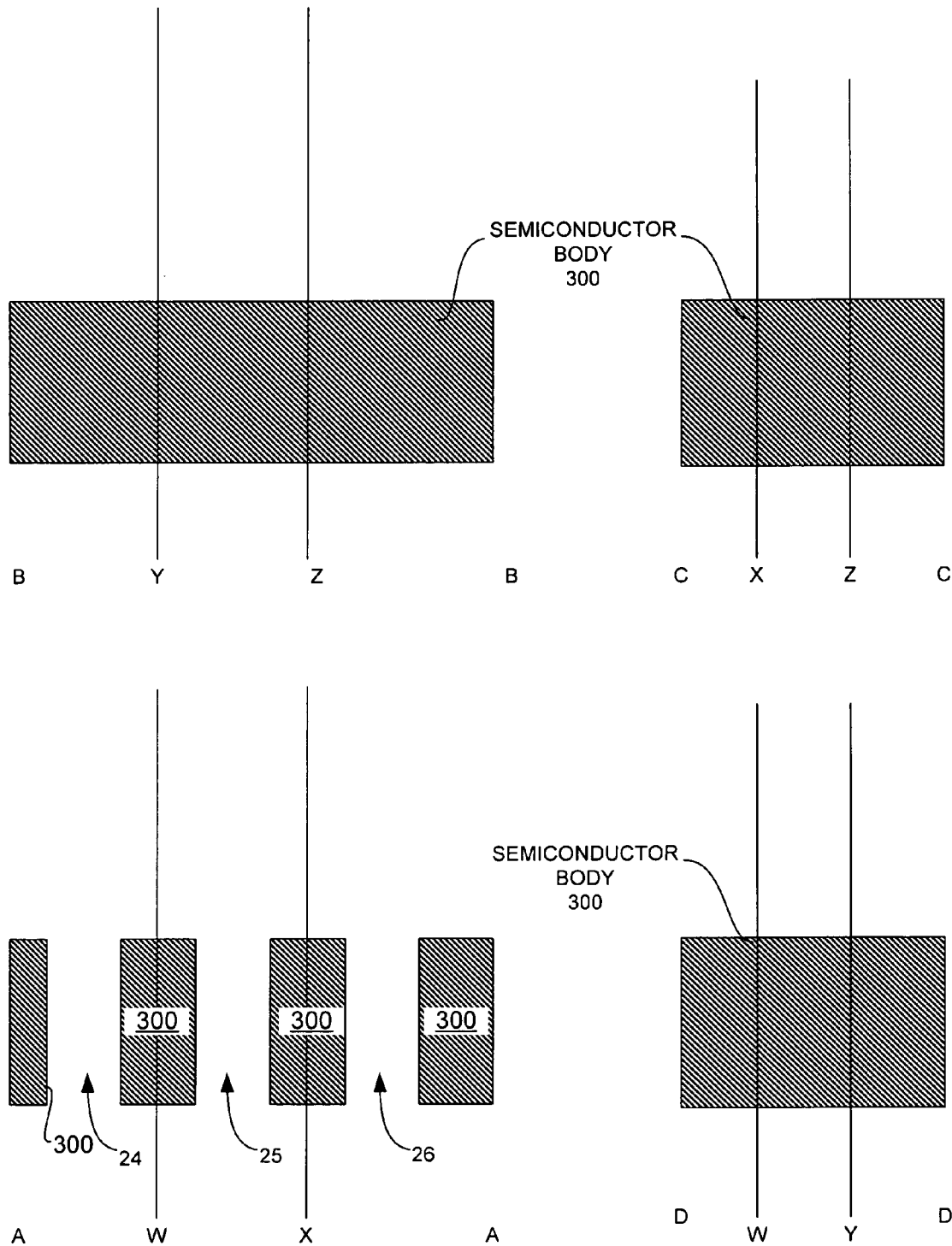
FIG. 9 is drawing of four cross-sections of a semiconductor body, one of the planes having a plurality of through-holes.

FIG. 9 is a cross-sectional diagram of semiconductor body 300 with a plurality of through-holes 310 disposed within semiconductor body 300. Through-holes 24-26 extend through semiconductor body 300 in plane A, however, planes B, C, and D do not intersect any through-holes. Through-holes 24-26 are shown extending completely through semiconductor body 300. The through-holes 24-26 are created by reactive ion etching the semiconductor body until the through-holes 24-26 extend from the upper surface of semiconductor body 300 through the semiconductor body to the bottom surface of semiconductor body 300.

Figure 10:
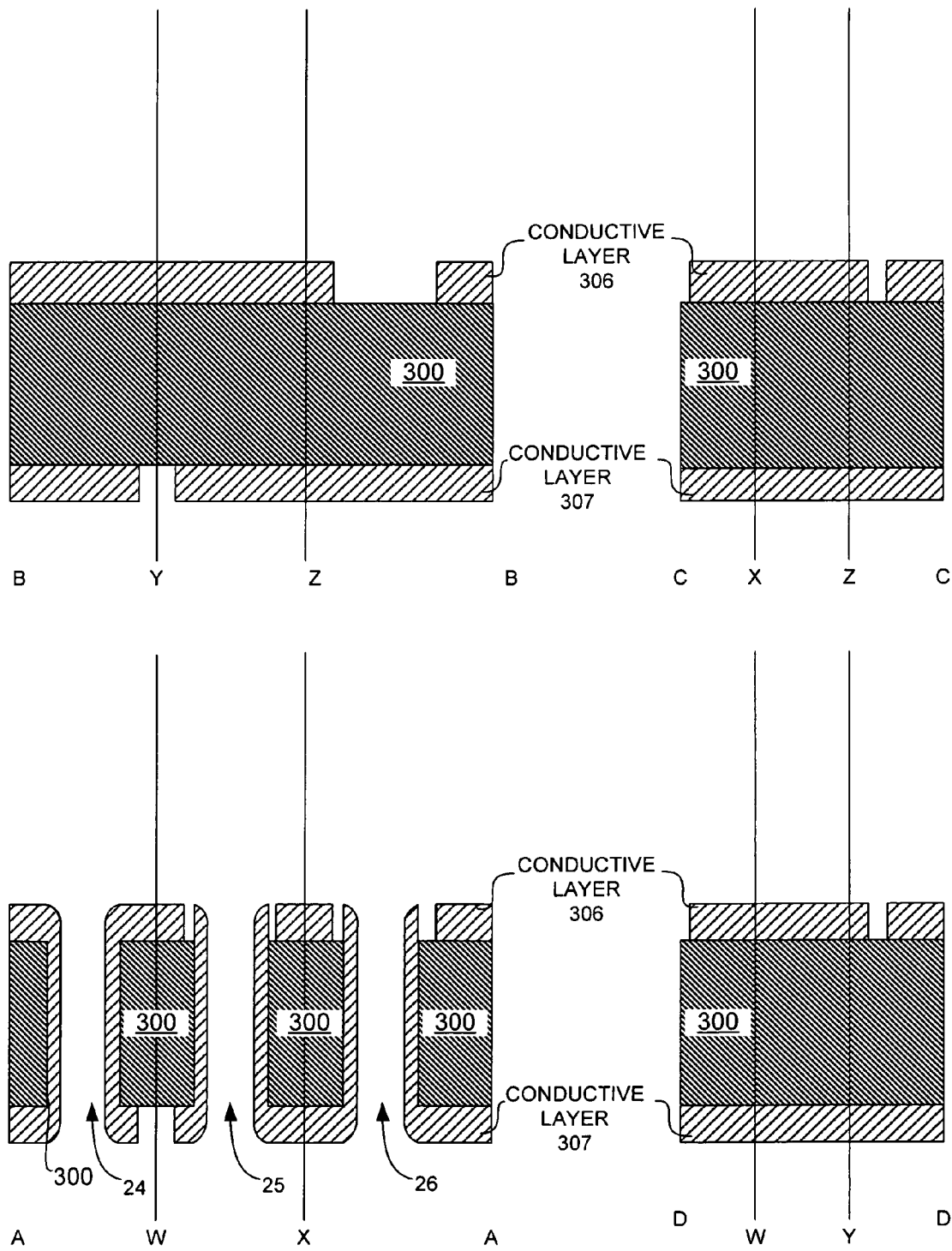
FIG. 10 is drawing of four cross-sections of the semiconductor body having a plurality of through-holes. A conductive layer has been disposed within the through-holes and on the top and bottom surfaces of the semiconductor body.

FIG. 10 is a cross-sectional drawing of semiconductor body 300, a conductive layer 306, a conductive layer 307, and through-holes 24-26. Conductive layer 306 is disposed on top of semiconductor body 300 and conductive layer 307 is disposed on the bottom of the semiconductor body 300. As shown in FIG. 10, conductive layer 306 and conductive layer 307 have partially filled through-holes 24-26 to create a plurality of conductive vias. The conductive vias extend from the conductive layer 306 on the top plane of semiconductor body 300 to conductive layer 307 disposed upon the bottom plane of semiconductor body 300. Conductive layers 306 and 307 may be copper, a copper-based alloy, or any similarly suitable material. Conductive layers 306 and 307 disposed onto semiconductor body 300 have been patterned and etched in FIG. 10. Conductive layers 306 and 307 are patterned using dry film photoresist. Dry film photoresist is used because of the presence of the plurality of through-holes 24-26 at the surface of semiconductor body 300. If wet or liquid photoresist is used, through-holes 24-26 do not allow for a uniform surface when the liquid resist is "spun on." Through-holes 24-26 create turbulence during the spin-on process used in wet or liquid resist processing which prohibits a uniform thickness of photoresist. Dry film resist involves thicker layers of photoresistive material, and thus features smaller than twenty or thirty microns cannot be resolved using dry film photoresist because of its thickness. Therefore, while the dry film photoresist produces a pattern of conductors sufficient to route power conductors, a different approach is generally required for the thin fine pitch conductors used for high density signal routing.

Figure 11:
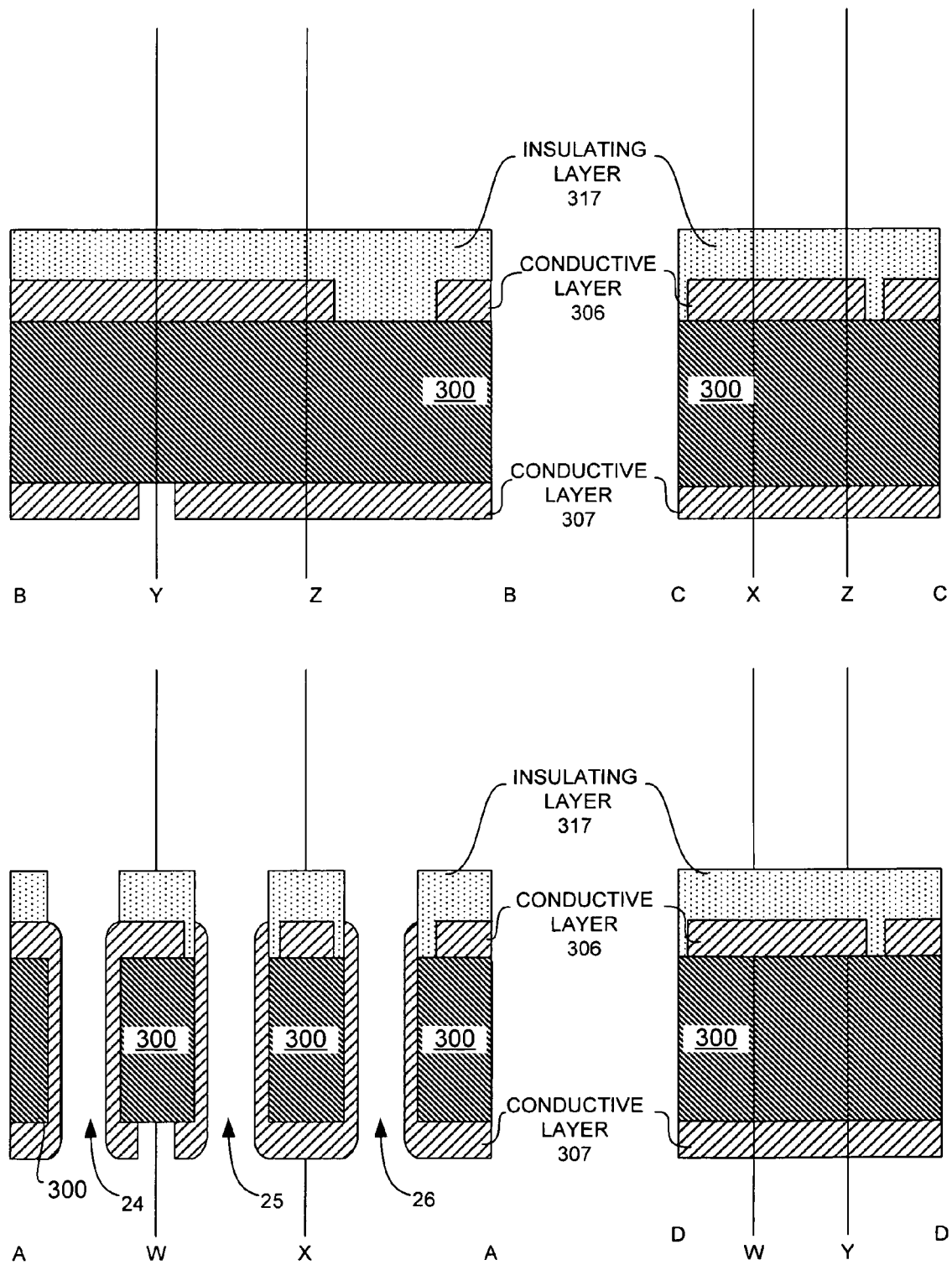
FIG. 11 is a drawing of four cross-sections of a semiconductor body. A layer of insulating material has been disposed upon one side of the semiconductor body and etched to allow for subsequent connections to be made to the conductive layer disposed below the insulating material.

FIG. 11 is a cross-sectional drawing showing an insulating layer 317 applied above the conductive layer 306 of semiconductor body 300. Insulating layer 317 has been patterned and etched to allow for electrical connections of subsequent applications of conductive layers. Additional conductive layers may then electrically connect to conductive layer 306 disposed on top of semiconductor body 300.

Figure 12:
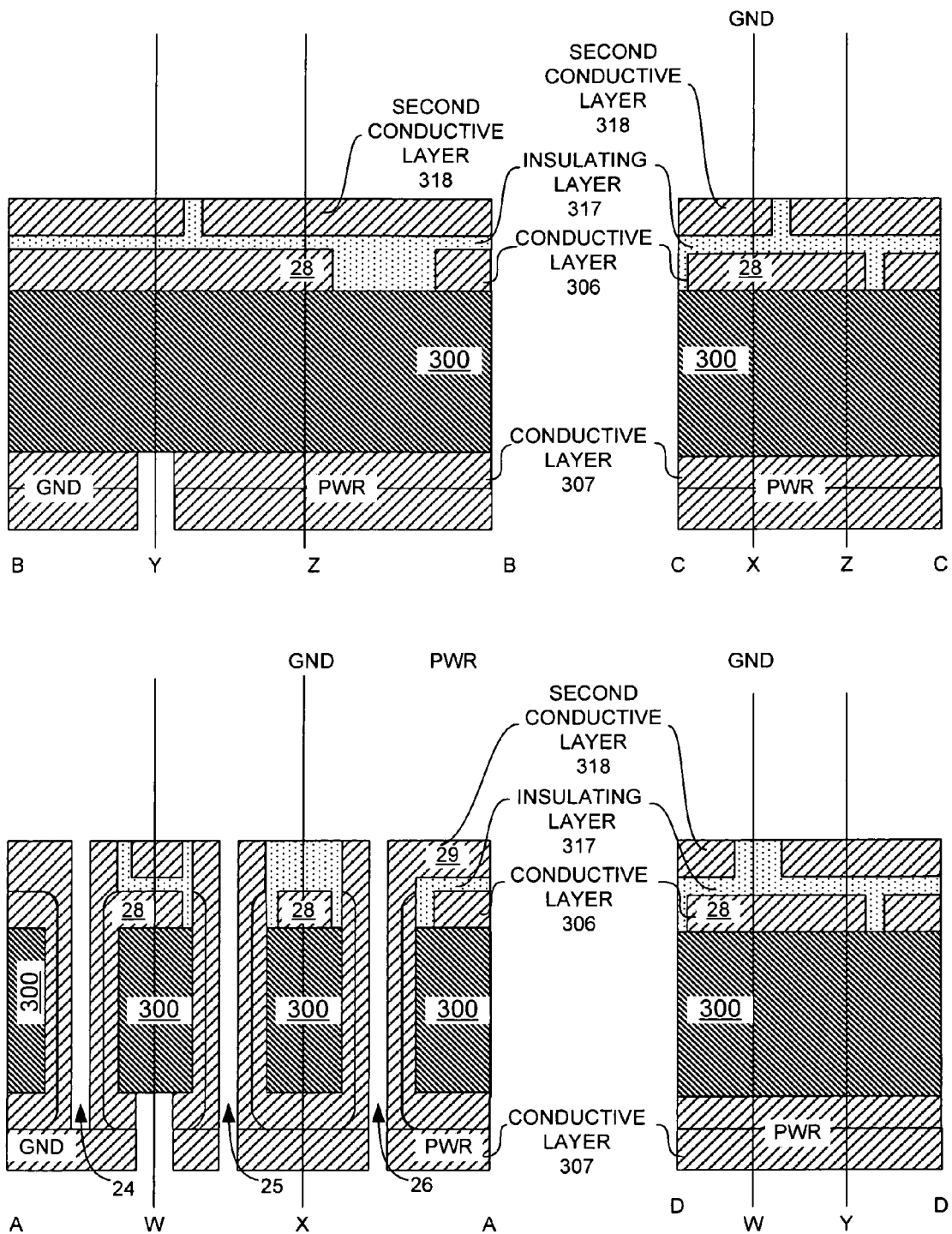
FIG. 12 is a drawing showing four cross-sections wherein a second conductive layer is disposed upon the layer of insulating material. A second conductive layer has been deposited on the bottom surface and etched in a desired manner.

FIG. 12 is a cross-sectional drawing showing each of four planes A, B, C, and D intersecting through power connection structure 85 of FIG. 5. The power connection structure includes a second conductive layer 318, insulating layer 317, conductive layer 306, semiconductor body 300, and conductive layer 307. Second conductive layer 318 is disposed above first conductive layer 306. Conductive layer 318 is patterned to permit contact to conductive layer 306 and conductive layer 307 at desired locations. Additionally, conductive layer 318 is patterned to allow for future locations where vias can be etched through to provide electrical connections to underlying layers. Conductive layer 307 disposed upon the bottom plane of semiconductor body 300 has also been made thicker as another layer of conductive material has been disposed upon the bottom side of the power connection structure. Because an insulating layer is not present on the bottom of the structure of FIG. 12, the effect is to make a thicker, less resistive conductive layer 307 disposed upon the bottom plane of semiconductor body 300. Second conductive layer 318 is also disposed within through-holes 24-26 and makes electrical connections to conductive layer 307 in desired locations. Similar to conductive layers 306 and 307, conductive layer 318 is patterned using dry film photoresist. Dry film photoresist is used because of the presence of the plurality of through-holes 24-26 at the surface of semiconductor body 300.

Figure 13:
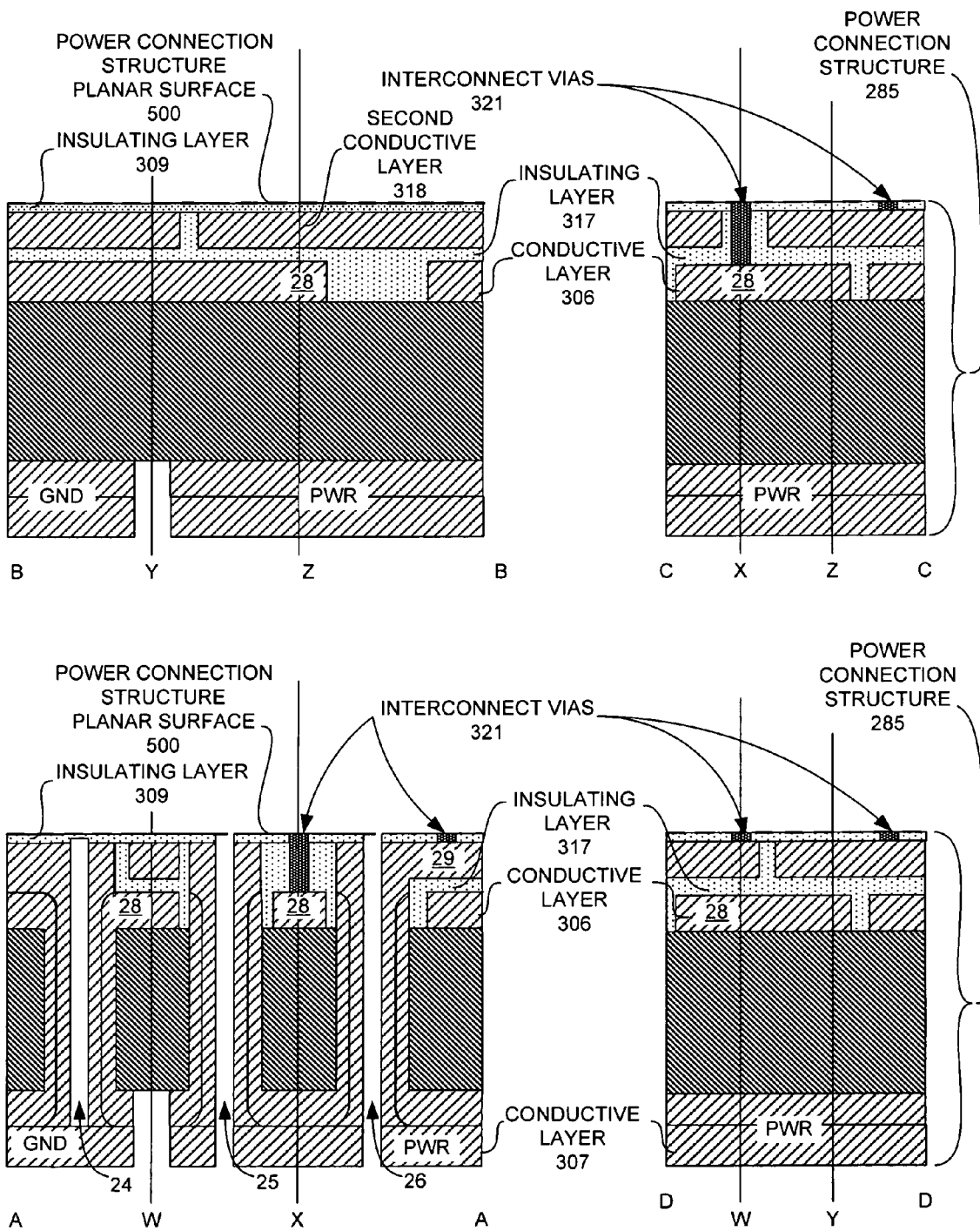
FIG. 13 is a drawing of a power connection structure in accordance with the present invention. Four cross-sections are shown.

FIG. 13 is a cross-sectional drawing of four planes A, B, C, and D, intersecting power connection structure 285 of a semiconductor substrate as those planes are drawn in FIG. 7. Power connection structure 285 includes an insulating layer 309, a plurality of interconnect vias 321, conductive layers 306, 307, and 318, insulating layer 317, semiconductor body 300, a power connection structure planar surface 500, and through-holes 24-26. Insulating layer 309 is disposed above second conductive layer 318 and interconnect vias 321 have been etched to allow electrical connections to extend from the top plane of the power connection structure to conductive layer 306 and second conductive layer 318. The power connection structure planar surface 500 is made by polishing and cleaning the surface of power connection structure 285 within a few atoms of flatness.

Figure 14:
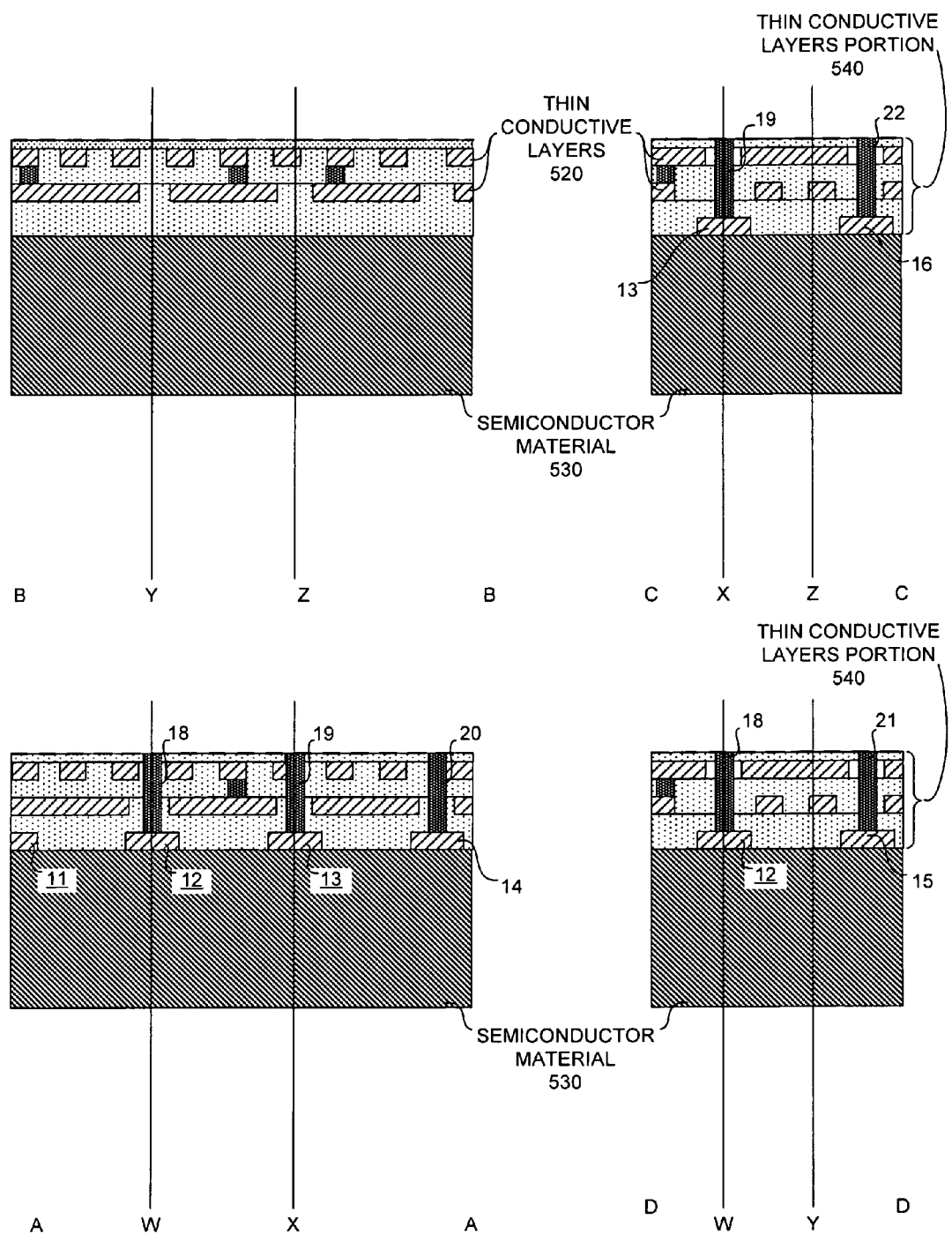
FIG. 14 is drawing of four cross-sections wherein a plurality of thin conductive layers is disposed upon one side of a substrate of semiconductor material.

FIG. 14 is a drawing of four cross-sections of a semiconductor material 530 and a thin conductive layers portion 540. Thin conductive layers portion 540 includes a plurality of lands 11-16, interconnect vias 18-22, and thin conductor layers 520. This thin conductive layers portion 540 may be produced by standard dual damascene processing utilizing liquid resist processing. Liquid resist processing is possible in this step of creating the structure of FIG. 14 because through-holes are not present in semiconductor material 530 nor in thin conductive layers portion 540. As a result of a different processing technique for the thin conductor layers portion 540, the thin conductive layers 520 are fine pitch conductors and can be made of sufficient density to pattern thousands of conductive traces necessary for interconnecting the plurality of FPGA dice mounted at the surface of the semiconductor substrate 250 of FIG. 4. The conductive layers within thin conductive layers portion 540 are approximately twenty microns or less in thickness. Conductive vias 18-22 have been patterned into the thin conductive layers portion 540 to allow connection to corresponding vias on the power connection structure planar surface 500 of FIG. 13.

Figure 15:
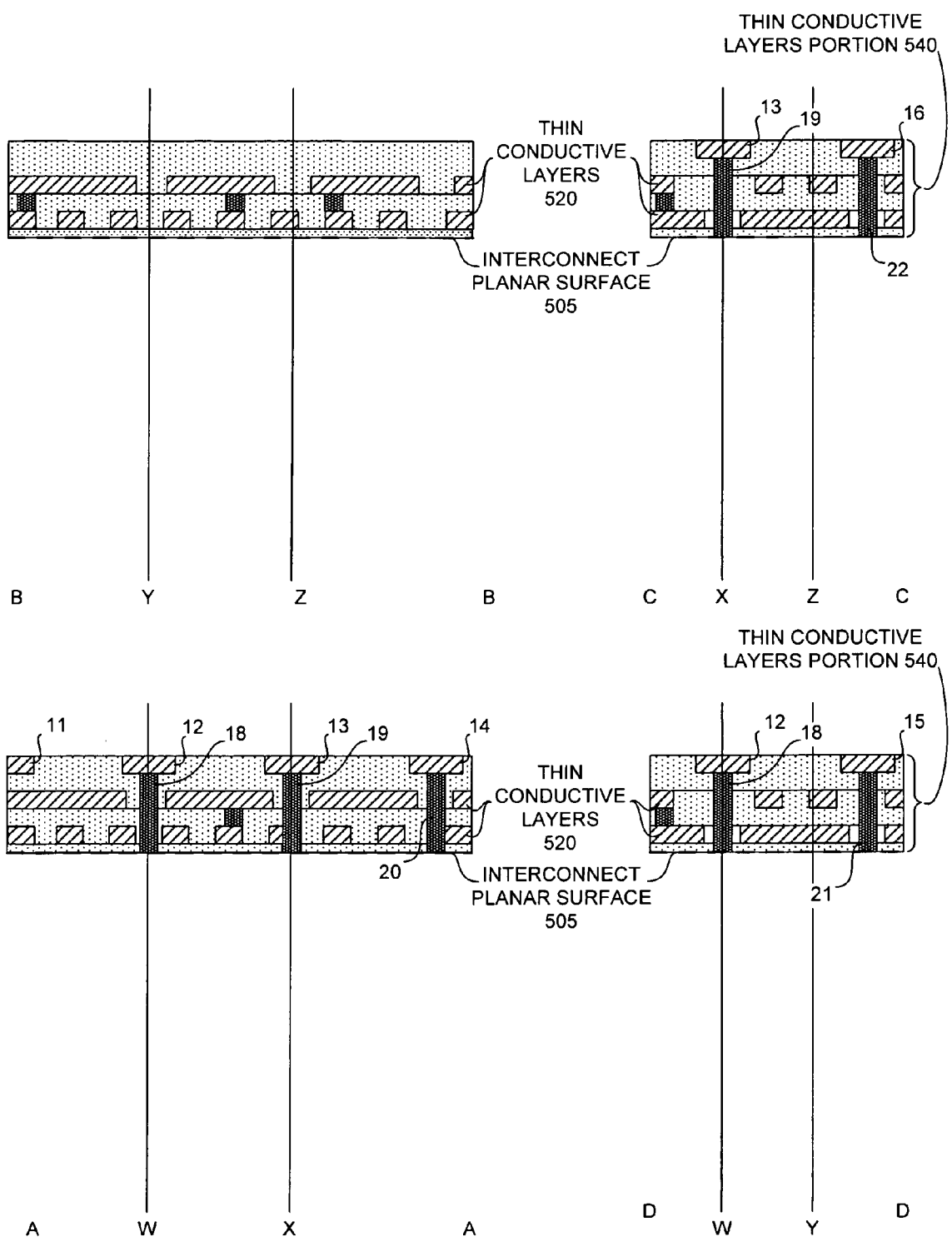
FIG. 15 is drawing of four cross-sections of an interconnect structure involving thin signal conductors.

FIG. 15 is a drawing of four cross-sections of thin conductor layers portion 540 after semiconductor material 530 has been backlapped away. The removal of semiconductor material 530 leaves interconnect planar surface 505 devoid of crystalline semiconductor material. This conductor layers portion 540 includes an interconnect planar surface 505. Interconnect planar surface 505 is made by polishing and cleaning the surface of power connection structure 285 within a few atoms of flatness. In other embodiments, semiconductor material 530 is not backlapped until after the interconnect structure and the power connection structure are connected together.

Figure 16:
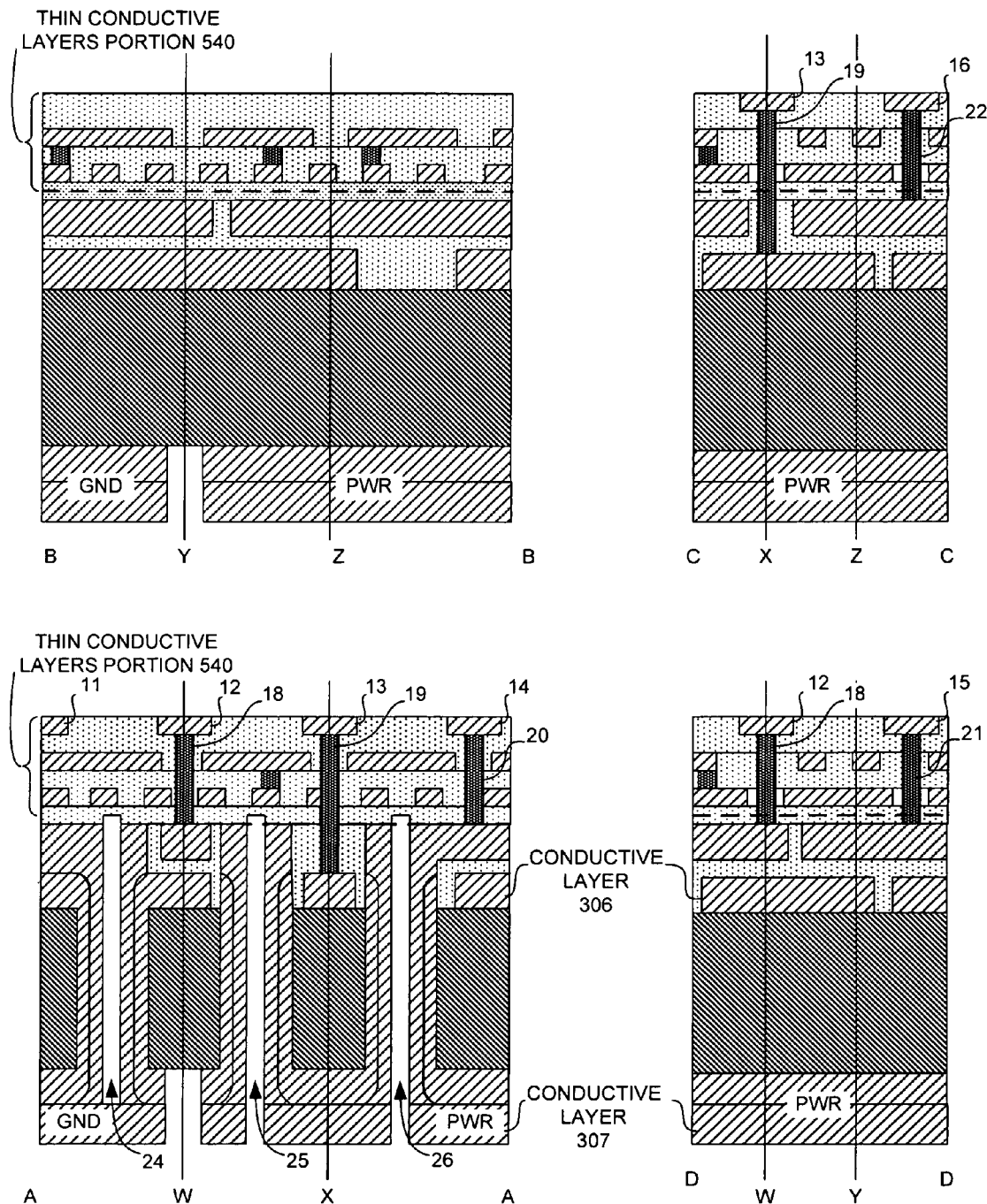
FIG. 16 is a drawing of four cross-sections of the power connection structure of FIG. 13 attached to the interconnect structure of FIG. 15 in accordance with one novel aspect.

FIG. 16 is a cross-sectional diagram showing four cross sections of a semiconductor substrate. The semiconductor substrate includes thin layers portion 540 of interconnect structure 280 of FIG. 5, and power connection structure 285 of FIG. 13. The interconnect planar surface 505 of thin conductor layers portion 540 of FIG. 15 is fusion bonded to power connection structure planar surface 500 of FIG. 13. To fusion bond a wafer containing power connection structures to a wafer containing interconnect structures, the surfaces of the both wafers are polished within a few atoms of flatness. This level of flatness is required for fusion bonding and the requisite level of flatness may be ensured by utilization of a sensitive photon detector. The wafers are then aligned using through-holes or other structures within the semiconductor substrate as a guide. The structures are then brought into physical contact where atomic bonding or crystalline bonding occurs naturally. These bonds are approximately 10.5 kcal/mol and sufficient to hold the wafers firmly together. After fusion bonding, the single-crystalline material of the semiconductor wafer 530 is backlapped from (removed from) the fusion bonded structure and die bonding bumps 1-8 are added. By creating the power connection and the interconnect structures separately on different wafers, an additional advantage is obtained because the wafers containing the high density, fine pitch, thin conductors of the interconnect structure can be tested independently from the power connection structures and defective wafers can be discarded before they are attached to non-defective power connection structure wafers. Additionally, die bond pads 535 are shown at the surface of the interconnect structure in FIG. 16. Lastly the individual semiconductor substrates are singulated from the fusion bonded wafers for attachment of components, power bus bars and connectors.

Figure 17:
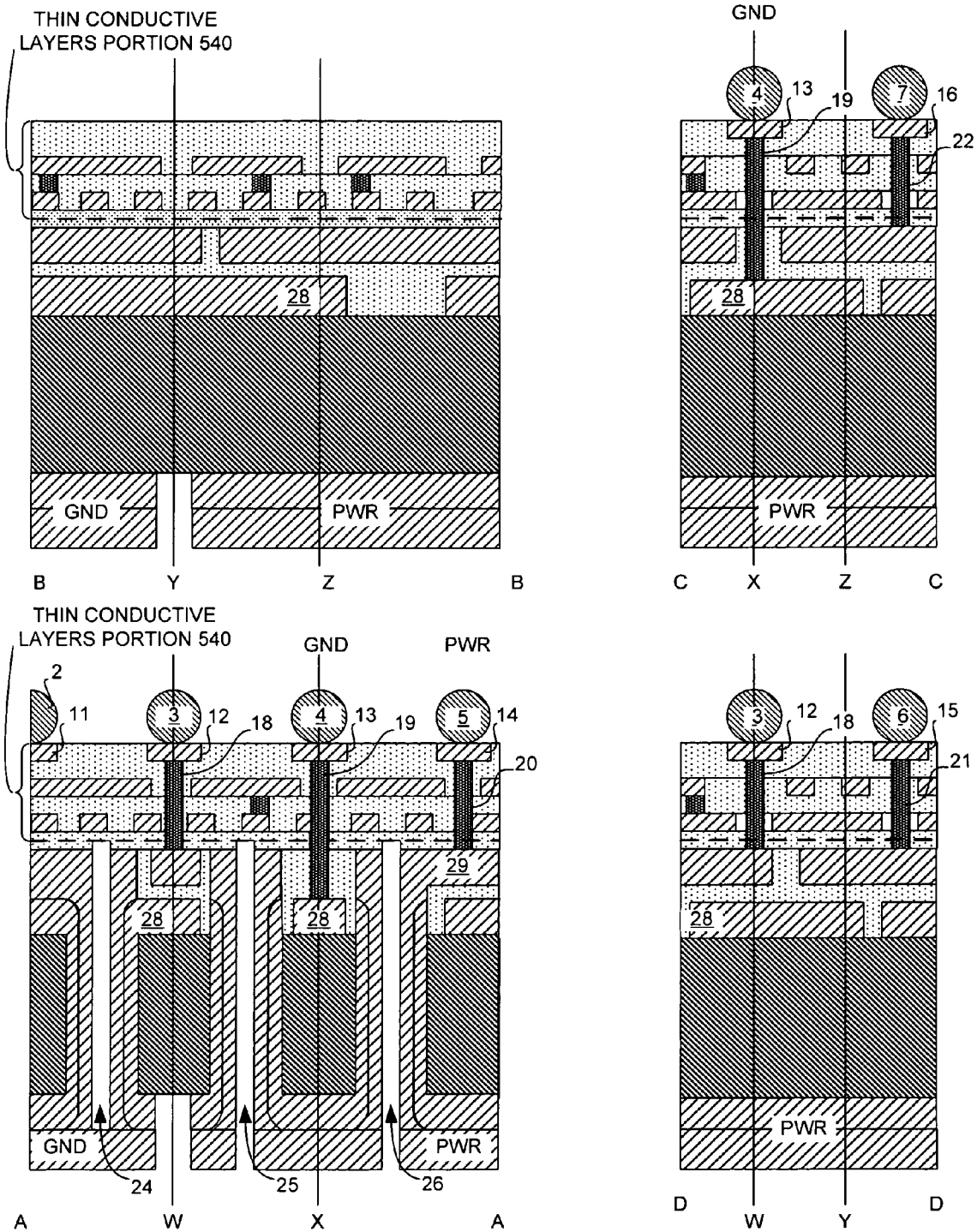
FIG. 17 is a cross-sectional drawing wherein die bonding bumps are disposed along the surface of the interconnect structure. The interconnect structure is attached to the power connection structure in accordance with one novel aspect.

FIG. 17 is a drawing showing four cross-sections of a semiconductor substrate 250 of FIG. 4. The cross-sections shown are planes A, B, C, and D of FIG. 7. Semiconductor substrate 250 includes die bonding bumps 2-7, lands 11-16, interconnect vias 18-22, interconnect structure 280 and power connection structure 285. A network 28 of conductive metal is disposed within the power connection structure 285. A second network 29 of conductive metal is also disposed within power connection structure 285; second network 29 is electrically isolated from network 28. Electrical connections are present from the top of the semiconductor substrate 250 to a conductive layer on the bottom of semiconductor substrate 250. In the semiconductor substrate of FIG. 17, die bonding bump 5, in plane A, is electrically connected to land 14. Land 14 is further electrically connected to interconnect via 20 which is electrically connected to network 29 within the power connection structure 285. Network 29 is electrically connected via conductive metal within through-hole 26 to a portion of conductive layer 307 of FIG. 13. Conductive network 28 is electrically isolated from conductive network 29 and electrically connects die bonding bump 4 to a portion of an electrically conductive layer on the bottom of semiconductor substrate 250. Shown in plane A of FIG. 17, die bonding bump 4 is electrically connected to land 13 which is electrically connected to conductive network 28 through interconnect via 19. At point "X" in plane C, a conductor of conductive network 28 extends perpendicularly to plane A to a point "Z" in plane C where it then extends horizontally from point "Z" to point "Y" in plane B. The conductor then extends perpendicularly in plane D to a point "W" where it extends into plane A and makes electrical contact via through-hole 24 to a portion of conductive layer 307 of FIG. 13.

Figure 18:
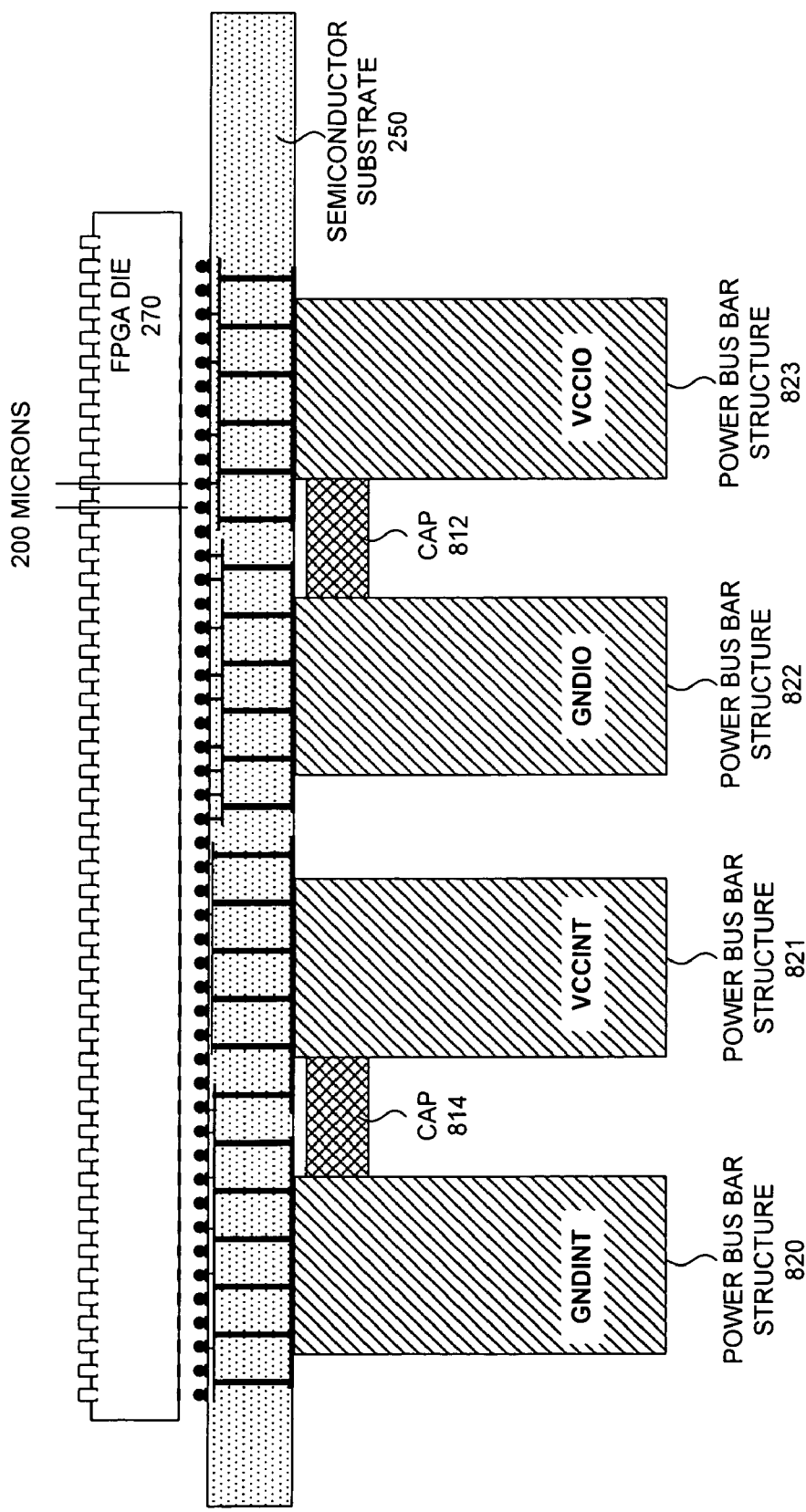
FIG. 18 is a cross-sectional drawing of a semiconductor substrate showing a partial FPGA die and a plurality of power bus bar structures.

FIG. 18 is a cross-sectional drawing of a semiconductor substrate 250 showing a partial FPGA die 270 and a plurality of power bus bar structures. Decoupling capacitors 812 and 814 are shown disposed between the power bus bar structures 820-823. The power bus bar structures are solid copper bars approximately 1.5 millimeters high by 1.5 millimeters wide. There are about ten copper power bus bars under each FPGA die and each power bus bar spans the entire width of the semiconductor substrate. Each copper bus bar may provide for a hundred or more vertical connections facilitated by the vertical through-holes such that the voltage drop from bus bar to FPGA is less than approximately twenty to thirty millivolts. This small amount of loss can be compensated for by a similar increase in the voltage output by the power supply used to supply the FPGA dice. In addition to providing power through the bottom of the semiconductor substrate, the vertical through-holes also strengthen the structure by riveting the copper plane located on the bottom plane of the semiconductor substrate to the semiconductor substrate.

Figure 19:
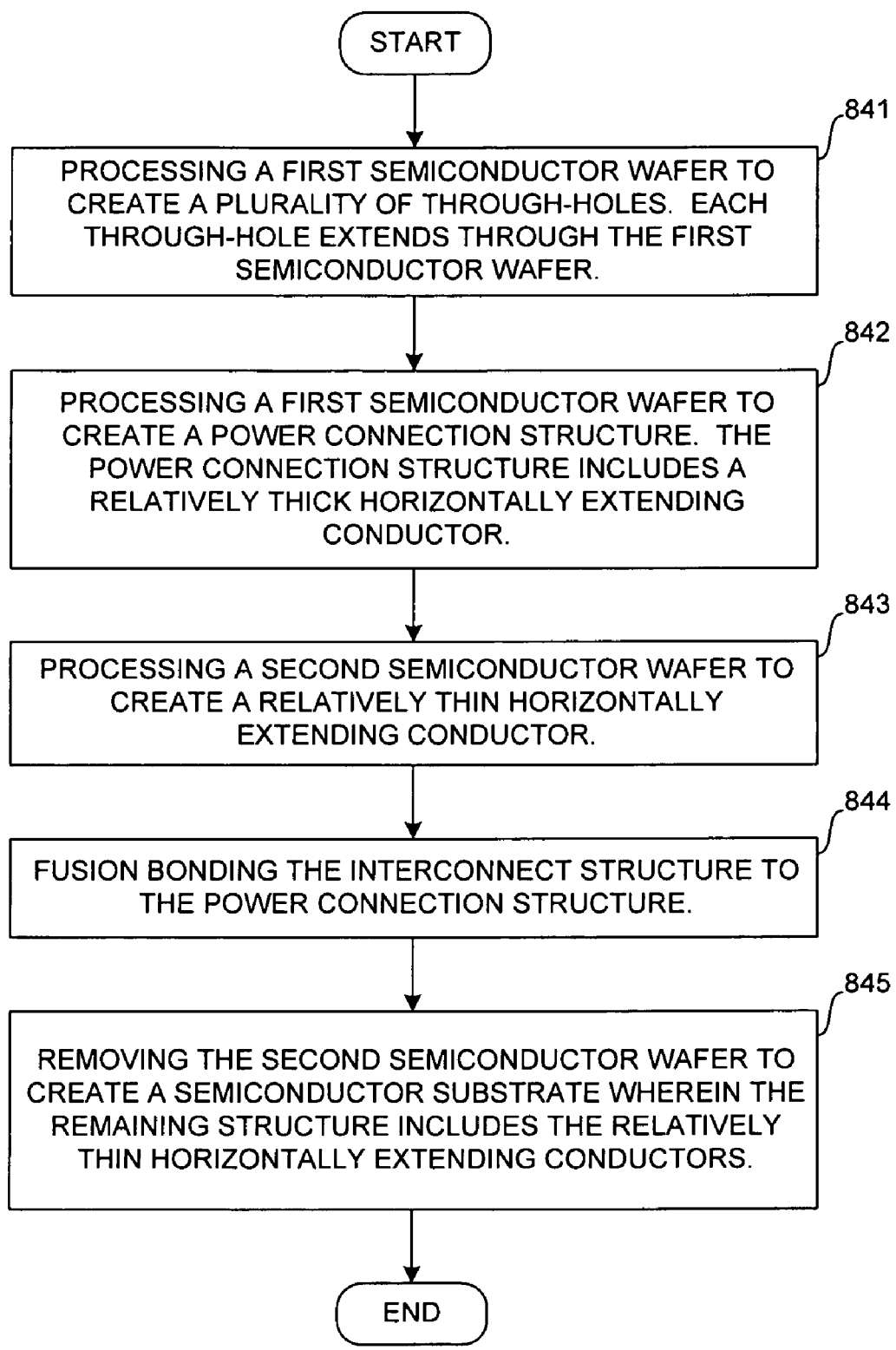
FIG. 19 is a flowchart of a novel method of making a semiconductor substrate.

FIG. 19 is a flowchart of a novel method of making a semiconductor substrate. In a first step 841 a first semiconductor wafer is processed to create a plurality of through-holes. Through-holes, approximately sixty microns in diameter, are etched through the wafer. Each through-hole extends through the semiconductor wafer. The through-holes (in second area 260 of FIG. 4) are spaced four-hundred microns apart.

In a second step 842, the first semiconductor wafer is processed to create a power connection structure. The power connection structure includes a relatively thick horizontally extending conductor. To process the horizontal conductor, dry film processing is used. Dry film processing is not incompatible with the through-holes present in the wafer.

In a third step 843, a second semiconductor wafer is processed to create a relatively thin horizontally extending conductor. The thin horizontally extending conductors are of fine pitch and are created by dual damascene processing or other well known methods. Connections are also present in the interconnect structure that will align with and electrically couple to the thick horizontally extending conductors within the power connection structure.

In a fourth step 844, the interconnect structure 280 is fusion bonded to the power connection structure 285 to create a semiconductor substrate 250. To fusion bond the two structures, the surfaces of both structures are polished within a few atoms of flatness. The wafers are then aligned using through-holes or other structures within the semiconductor substrate as a guide. The structures are then brought into physical contact where atomic bonding or crystalline bonding occurs naturally.

In a fifth step 845, the second semiconductor wafer is removed from the interconnect structure. The semiconductor wafer portion is removed by backlapping. After removal, the interconnect structure including the relatively thin horizontally extending conductors remains.

Figure 20:
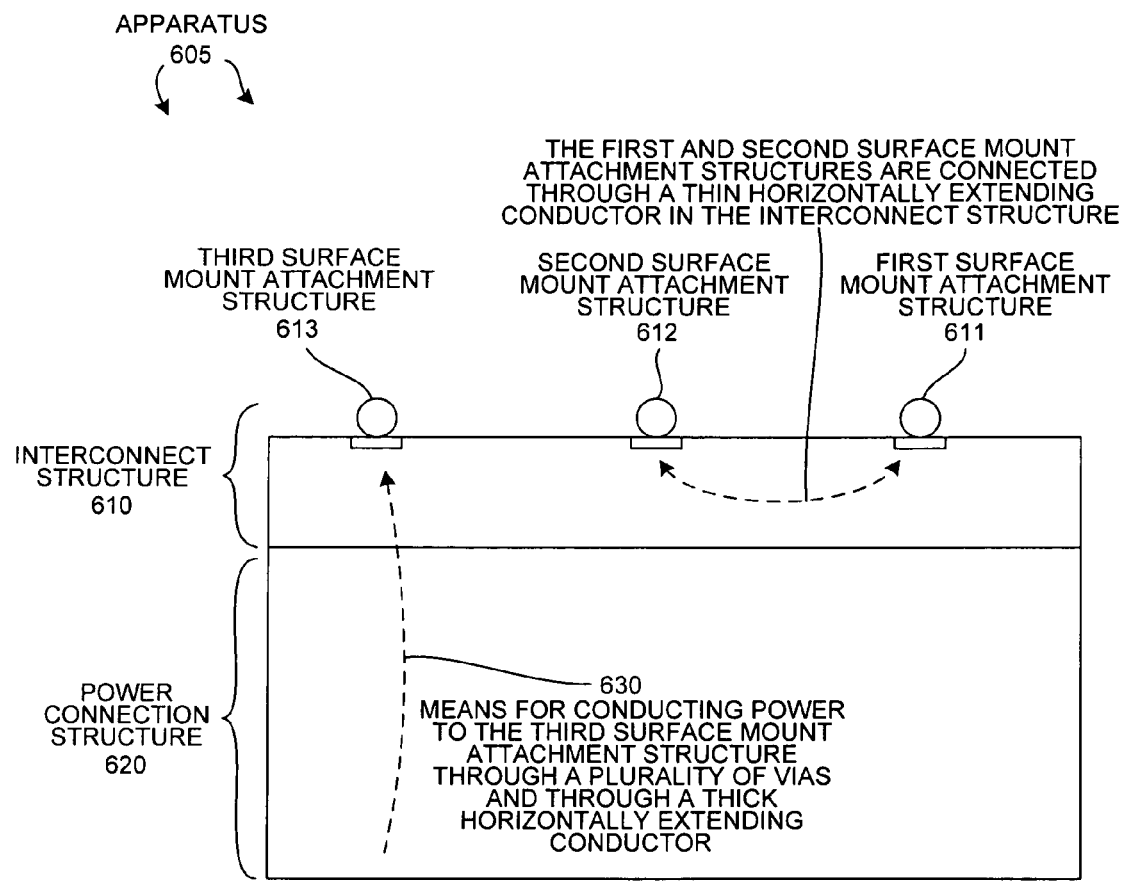
FIG. 20 is a diagram of an apparatus in accordance with one novel aspect.

FIG. 20 is a diagram of an apparatus 605 comprising: a first surface mount attachment structure 611; a second surface mount attachment structure 612 that is connected to the first surface mount attachment structure 611 through a thin horizontally extending conductor, wherein the thin horizontally extending conductor has a thickness of no more than two microns; a third surface mount attachment structure 613; and means 630 for conducting power through a plurality of vias, then through a thick horizontally extending conductor, and to the third surface mount attachment structure 613, the thick horizontally extending conductor having a width of at least twenty five microns. In one example, the means 630 includes a part of an interconnect structure 610 and a power connection structure 620, wherein the interconnect structure 610 includes the thin horizontally extending conductor and wherein the power connection structure 620 includes the thick horizontally extending conductor, and wherein the interconnect structure 610 is fusion bonded to the power connection structure 620. For additional detail on an interconnect structure, see interconnect structure 280 of FIG. 5 and the corresponding text. For additional detail on a power connection structure, see power connection structure 285 of FIG. 5 and the corresponding text.

In another embodiment, a power connection structure has a semiconductor power through-hole portion and a thick conductor layers portion. The semiconductor power through-hole portion has a semiconductor body and through-holes extending from the top surface of the semiconductor body to the bottom surface of the semiconductor body. The thick conductor layers portion fixed to the top of the semiconductor power through-hole portion has a planar surface. An interconnect structure has a thin conductor layers portion and surface mount attachment structures usable to surface mount integrated circuit dice to the interconnect structure. The thin conductor layers portion has a planar surface fusion bonded to the planar surface of the thick conductor layers portion of the power connection structure.

In another embodiment, a semiconductor wafer is processed to create through-holes extending through the semiconductor wafer. The semiconductor wafer is further processed to create a power connection structure that includes relatively thick horizontally extending conductors. A second semiconductor wafer is processed to create an interconnect structure that includes relatively thin horizontally extending conductors. The two semiconductor wafers are fusion bonded to form a single fusion bonded structure. The second semiconductor wafer is removed, leaving behind a semiconductor substrate that includes the relatively thin horizontally extending conductors.

The interconnect structure and the power connection structure each have a planar surface. The planar surfaces of the interconnect structure and the power connection structure physically contact each other within atomic dimensions such that direct bonds exist between the interconnect structure and the power connection structure without any adhesive material being disposed between the interconnect structure and the power connection structure. The resulting fusion bonded structure can be annealed to strengthen the direct bonds. The fusion bonded structure is less than one thousand four hundred microns thick. The fusion bonded structure can be sectioned to create semiconductor substrates. In one example, the semiconductor substrates have a length of at least one inch and a width of at least two inches. Integrated circuit dice can be surface mounted to each of the semiconductor substrates.

Although certain specific embodiments are described above for instructional purposes, the teachings of this patent document have general applicability and are not limited to the specific embodiments described above. Although an example is described above where bare FPGA integrated circuit die are surface mounted to a semiconductor substrate, in other embodiments packaged FPGA integrated circuits are attached to the semiconductor substrate. Accordingly, various modifications, adaptations, and combinations of various features of the described embodiments can be practiced without departing from the scope of the invention as set forth in the claims.

What is claimed is:

1. A method comprising:
    (a) processing a first semiconductor wafer to create a plurality of through-holes, wherein each through-hole extends through the first semiconductor wafer;
    (b) processing the first semiconductor wafer to create a power connection structure, the power connection structure including a relatively thick horizontally extending conductor;
    (c) processing a second semiconductor wafer to create a relatively thin horizontally extending conductor, wherein the processing used to create the relatively thin horizontally extending conductor is incompatible with the processing used to create the power connection structure;
    (d) fusion bonding the first semiconductor wafer to the second semiconductor wafer to form a fusion bonded structure; and
    (e) removing the second semiconductor wafer to create a semiconductor substrate, wherein the remaining semiconductor substrate includes the relatively thin horizontally extending conductor.

2. A method comprising:
    (a) processing a first semiconductor wafer to create a plurality of through-holes, wherein each through-hole extends through the first semiconductor wafer;
    (b) processing the first semiconductor wafer to create a power connection structure, the power connection structure including a relatively thick horizontally extending conductor;
    (c) processing a second semiconductor wafer to create a relatively thin horizontally extending conductor;
    (d) fusion bonding the first semiconductor wafer to the second semiconductor wafer to form a fusion bonded structure; and
    (e) removing the second semiconductor wafer to create a semiconductor substrate, wherein the remaining semiconductor substrate includes the relatively thin horizontally extending conductor, wherein the processing of step (b) involves dry film processing.

3. A method comprising:
    (a) processing a first semiconductor wafer to create a plurality of through-holes, wherein each through-hole extends through the first semiconductor wafer;
    (b) processing the first semiconductor wafer to create a power connection structure, the power connection structure including a relatively thick horizontally extending conductor;
    (c) processing a second semiconductor wafer to create a relatively thin horizontally extending conductor;
    (d) fusion bonding the first semiconductor wafer to the second semiconductor wafer to form a fusion bonded structure; and
    (e) removing the second semiconductor wafer to create a semiconductor substrate, wherein the remaining semiconductor substrate includes the relatively thin horizontally extending conductor, wherein the processing of step (c) involves wet resist processing.

4. The method of claim 2, wherein the processing of step (c) involves wet resist processing.

5. The method of claim 1, wherein the first semiconductor wafer has a planar surface, wherein the power connection structure has a planar surface, and wherein the planar surfaces of the first semiconductor wafer and the power connection structure physically contact each other within atomic dimensions such that direct bonds exist between the first semiconductor wafer and the power connection structure without any adhesive material being disposed between the first semiconductor wafer and the power connection structure.

6. The method of claim 5, further comprising: (f) annealing the fusion bonded structure to strengthen the direct bonds.

7. The method of claim 1, further comprising: (f) sectioning the fusion bonded structure to create a plurality of semiconductor substrates, each semiconductor substrate having a length, a width and a height, wherein the length is at least one inch, and wherein the width is at least two inches; and (g) surface mounting a plurality of integrated circuit dice to each of the plurality of semiconductor substrates.

8. The method of claim 7, wherein a first of the plurality of integrated circuit dice is connected by conductors of the interconnect structure to a second of the plurality of integrated circuit dice.

9. The method of claim 1, wherein the fusion bonded structure of step (e) is less than one thousand four hundred microns thick.

10. A method comprising:
    (a) processing a first semiconductor wafer to create a first structure;
    (b) processing a second semiconductor wafer to create a second structure, wherein the processing used to create the second structure is incompatible with the processing used to create the first structure, and wherein a through-hole having diameter of at least sixty microns extends from a first planar surface of the second structure to a second planar surface of the second structure; and
    (c) fusion bonding the first structure to the first surface of the second structure to form a fusion bonded structure.

11. The method of claim 10, further comprising:
    (d) aligning the first structure to the second structure before the fusion bonding in (c), wherein the through-hole is used as a guide to perform the aligning.

12. The method of claim 10, wherein the first structure has a surface, further comprising:
    (d) polishing the surface of the first structure to within a few atoms of flatness before the fusion bonding in (c).

13. The method of claim 10, wherein the fusion bonding produces atomic bonds between the first structure and the second structure without the use of adhesives.

14. A method comprising:
    (a) processing a first semiconductor wafer to create a first structure;

(b) processing a second semiconductor wafer to create a second structure, wherein the processing used to create the second structure is incompatible with the processing used to create the first structure, and wherein a through-hole having diameter of at least sixty microns extends from a first planar surface of the second structure to a second planar surface of the second structure; and (c) fusion bonding the first structure to the first surface of the second structure to form a fusion bonded structure, wherein thin conductors are disposed within the first structure and are electrically coupled to an integrated circuit die, wherein thick conductors are disposed within the second structure and are electrically coupled to the integrated circuit die, wherein the thin conductors have a thickness of less than two microns, and wherein the thick conductors have a thickness of two microns or greater.

15. A method comprising:
(a) processing a first semiconductor wafer to create a first structure;
(b) processing a second semiconductor wafer to create a second structure, wherein the processing used to create the first structure is incompatible with the processing used to create the second structure; and
(c) fusion bonding the first structure to the second structure to form a fusion bonded structure.

16. The method of claim 15, wherein the first structure is an interconnect structure, and the second structure is a power connection structure.

17. A method comprising:
(a) processing a first semiconductor wafer to create a first structure;
(b) processing a second semiconductor wafer to create a second structure, wherein the processing used to create the first structure is incompatible with the processing used to create the second structure; and
(c) fusion bonding the first structure to the second structure to form a fusion bonded structure, wherein thin conductors are disposed within the first structure and are electrically coupled to an integrated circuit die, wherein thick conductors are disposed within the second structure and are electrically coupled to the integrated circuit die, wherein the thin conductors have a thickness of less than two microns, and wherein the thick conductors have a thickness of two microns or greater.

18. The method of claim 15, wherein the processing used to create the first structure is low-yielding, and wherein the processing used to create the second structure is high-yielding.

19. The method of claim 15, wherein the first structure has a surface, further comprising:
(d) polishing the surface of the first structure to within a few atoms of flatness before the fusion bonding in (c).

20. The method of claim 15, further comprising:
(d) attaching a field programmable gate array (FPGA) to the fusion bonded structure.

* * * * *